US 12,507,391 B2

(12) United States Patent
Oh

(10) Patent No.: US 12,507,391 B2
(45) Date of Patent: Dec. 23, 2025

(54) SEMICONDUCTOR DEVICE

(71) Applicant: SAMSUNG ELECTRONICS CO., LTD., Suwon-si (KR)

(72) Inventor: Juseong Oh, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 341 days.

(21) Appl. No.: 18/131,917

(22) Filed: Apr. 7, 2023

(65) Prior Publication Data
US 2024/0049441 A1 Feb. 8, 2024

(30) Foreign Application Priority Data

Aug. 4, 2022 (KR) .................. 10-2022-0097359

(51) Int. Cl.
*H10B 12/00* (2023.01)
*H10D 1/68* (2025.01)

(52) U.S. Cl.
CPC ....... *H10B 12/0335* (2023.02); *H10B 12/315* (2023.02); *H10B 12/482* (2023.02); *H10B 12/50* (2023.02); *H10D 1/696* (2025.01)

(58) Field of Classification Search
CPC .. H10B 12/00; H10B 12/033; H10B 12/0335; H10B 12/09; H10B 12/315; H10B 12/34; H10B 12/482; H10B 12/485; H10B 12/488; H10B 12/50; H10D 1/68; H10D 1/688; H10D 1/696
See application file for complete search history.

(56) References Cited

U.S. PATENT DOCUMENTS

| 6,461,911 B2 | 10/2002 | Ahn et al. |
| 6,798,006 B2 | 9/2004 | Amo et al. |
| 7,348,623 B2 | 3/2008 | Akiyama |
| 10,249,627 B2 | 4/2019 | Han et al. |
| 2002/0053686 A1 | 5/2002 | Suh |
| 2011/0079878 A1* | 4/2011 | Aggarwal ............ H10D 1/682 257/532 |
| 2022/0139836 A1* | 5/2022 | Son ................... H10B 12/09 257/296 |

FOREIGN PATENT DOCUMENTS

| KR | 10-2002-0036148 A | 5/2002 |
| KR | 10-2006-0000878 A | 1/2006 |
| KR | 10-2008-0084289 A | 9/2008 |
| KR | 10-2009-0072791 A | 7/2009 |

* cited by examiner

*Primary Examiner* — Brook Kebede
(74) *Attorney, Agent, or Firm* — Muir Patent Law, PLLC

(57) ABSTRACT

A semiconductor device includes a substrate; lower electrodes on the substrate; a dielectric layer on the lower electrodes; an upper electrode on the dielectric layer; a contact structure connected to the upper electrode; and a wiring layer on the contact structure, wherein the contact structure includes a lower plug, and an upper plug on the lower plug, an upper surface of the lower plug is substantially coplanar with an upper surface of the upper electrode, a first width of the upper surface of the lower plug is narrower than a second width of a lower surface of the upper plug, and the lower surface of the upper plug is in contact with the upper surface of the lower plug.

20 Claims, 28 Drawing Sheets

SEMICONDUCTOR DEVICE

CROSS-REFERENCE TO RELATED APPLICATION(S)

This application claims benefit of priority to Korean Patent Application No. 10-2022-0097359 filed on Aug. 4, 2022, in the Korean Intellectual Property Office, the disclosure of which is incorporated herein by reference in its entirety.

BACKGROUND

1. Field

Embodiments relate to a semiconductor device.

2. Description of the Related Art

With the development of the electronics industry and the needs of users, electronic devices have become smaller in size and higher in performance. Accordingly, semiconductor devices used in electronic devices also have a high degree of integration and implement high performance.

SUMMARY

The embodiments may be realized by providing a semiconductor device including a substrate; lower electrodes on the substrate; a dielectric layer on the lower electrodes; an upper electrode on the dielectric layer; a contact structure connected to the upper electrode; and a wiring layer on the contact structure, wherein the contact structure includes a lower plug, and an upper plug on the lower plug, an upper surface of the lower plug is substantially coplanar with an upper surface of the upper electrode, a first width of the upper surface of the lower plug is narrower than a second width of a lower surface of the upper plug, and the lower surface of the upper plug is in contact with the upper surface of the lower plug.

The embodiments may be realized by providing a semiconductor device including a cell active region; a bit line electrically connected to a first region of the cell active region; an information storage structure electrically connected to a second region of the cell active region, the information storage structure including a lower electrode on the cell active region, a dielectric layer on the lower electrode, and an upper electrode on the dielectric layer; and a contact structure connected to the upper electrode, wherein the contact structure includes a lower plug, and an upper plug on the lower plug, the upper plug and the lower plug are buried in the upper electrode, a first width of an upper surface of the lower plug is narrower than a second width of a lower surface of the upper plug, and the lower surface of the upper plug is in contact with the upper surface of the lower plug.

The embodiments may be realized by providing a semiconductor device including a substrate having a cell region and a peripheral region; a first structure on the cell region; an information storage structure on the first structure; a contact structure on the information storage structure; a second structure on the peripheral region; and a peripheral contact structure on the second structure, wherein the information storage structure includes a lower electrode, a dielectric layer on the lower electrode, and an upper electrode on the dielectric layer, the contact structure includes a lower plug buried in the upper electrode and an upper plug on the lower plug, an upper surface of the lower plug is substantially coplanar with an upper surface of the upper electrode, a first width of the upper surface of the lower plug is narrower than a second width of a lower surface of the upper plug, and the peripheral contact structure includes a peripheral lower plug and a peripheral upper plug on the peripheral lower plug.

BRIEF DESCRIPTION OF DRAWINGS

Features will be apparent to those of skill in the art by describing in detail exemplary embodiments with reference to the attached drawings in which.

DETAILED DESCRIPTION

Figure 1A:
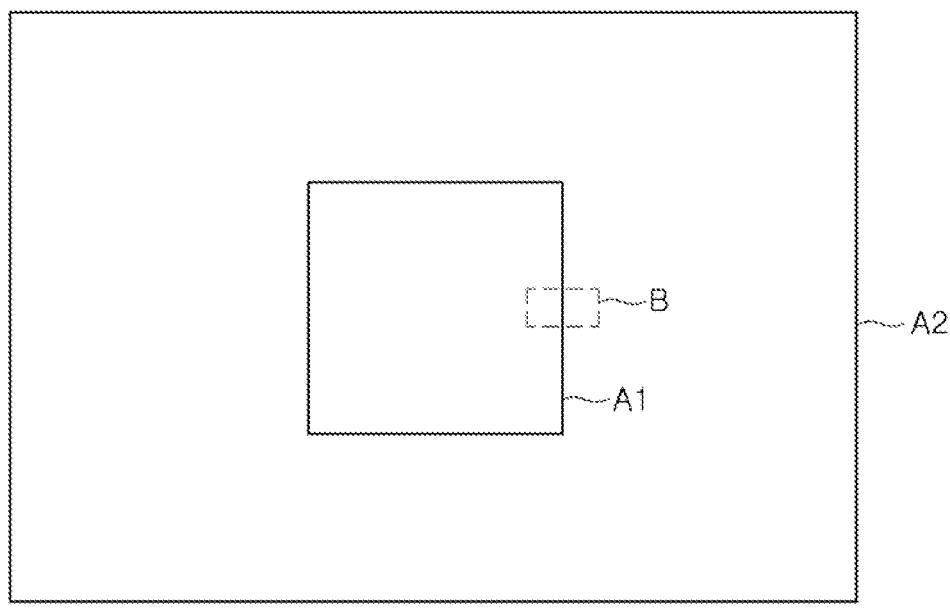
FIG. 1A is a plan view illustrating a semiconductor device according to example embodiments.

FIG. 1A is a plan view illustrating a semiconductor device according to example embodiments.

Figure 1B:
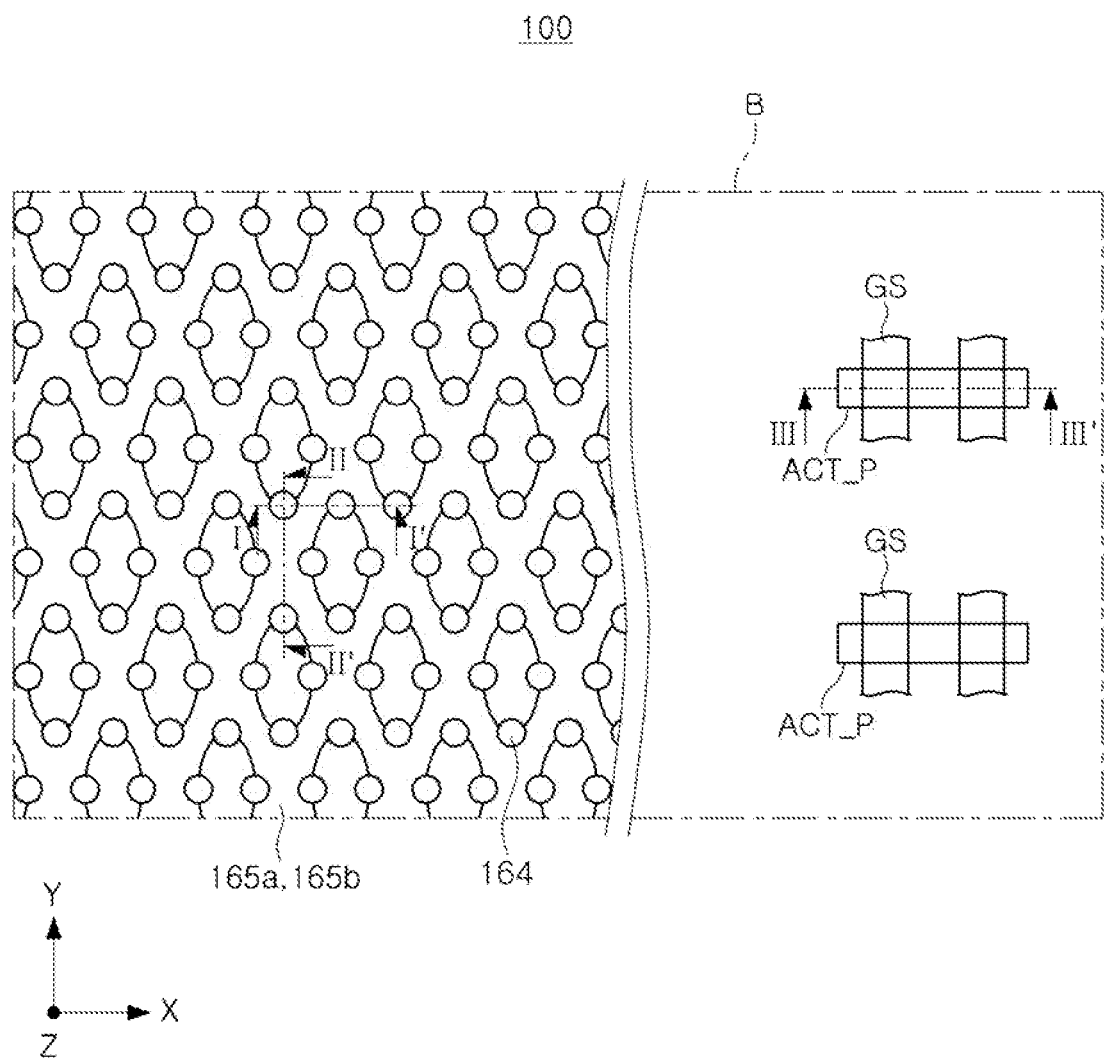
FIG. 1B is a partially enlarged plan view illustrating a partial region of a semiconductor device according to example embodiments.

FIG. 1B is a partially enlarged plan view illustrating a partial region of a semiconductor device according to example embodiments. FIG. 1B is an enlarged view of region "B" of FIG. 1A.

Figure 2:
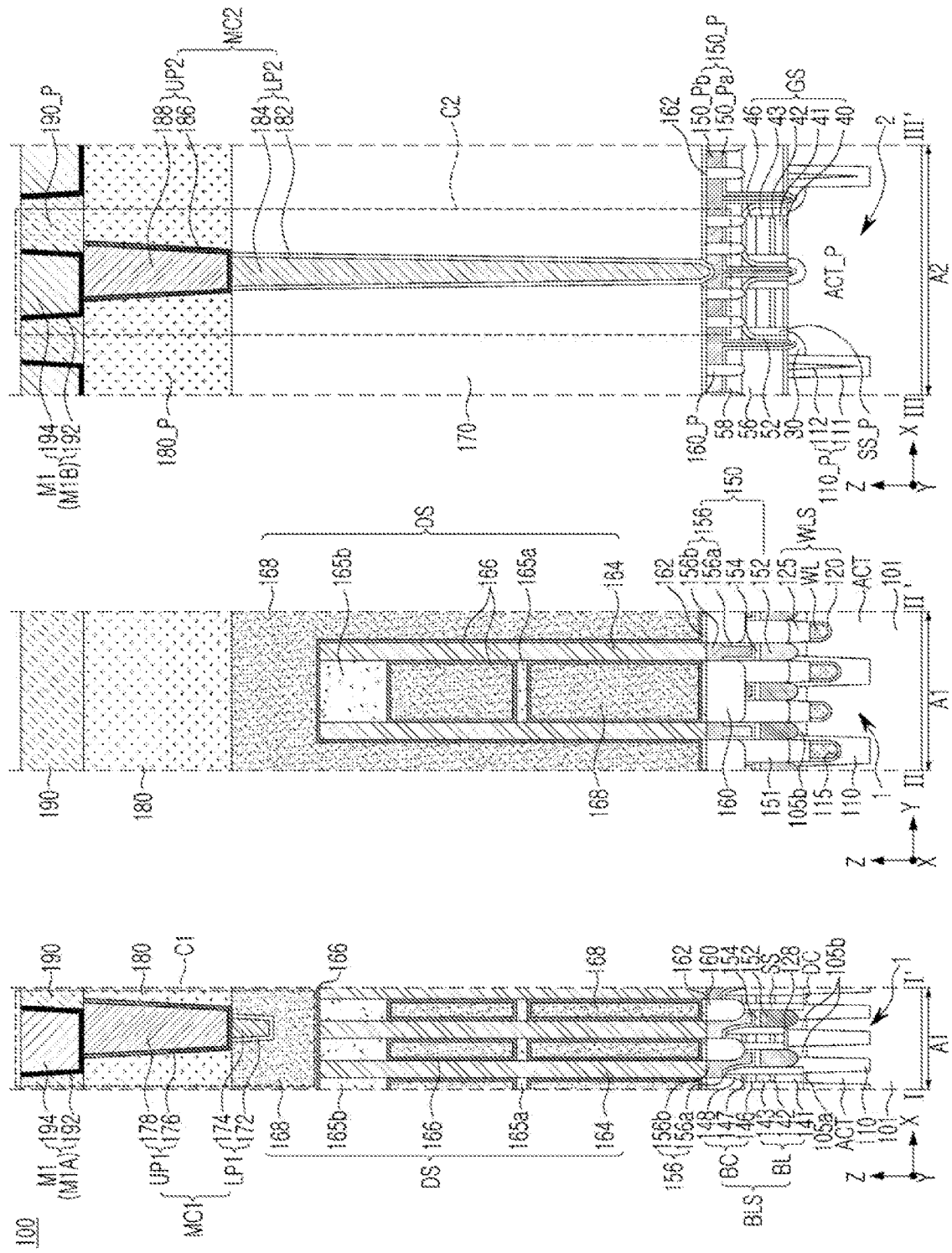
FIG. 2 is a cross-sectional view of a semiconductor device according to example embodiments.

FIG. 2 is a cross-sectional view of a semiconductor device according to example embodiments. FIG. 2 illustrates cross-sections taken along lines I-I', II-II', and III-III' of FIG. 1B.

Figure 3A:
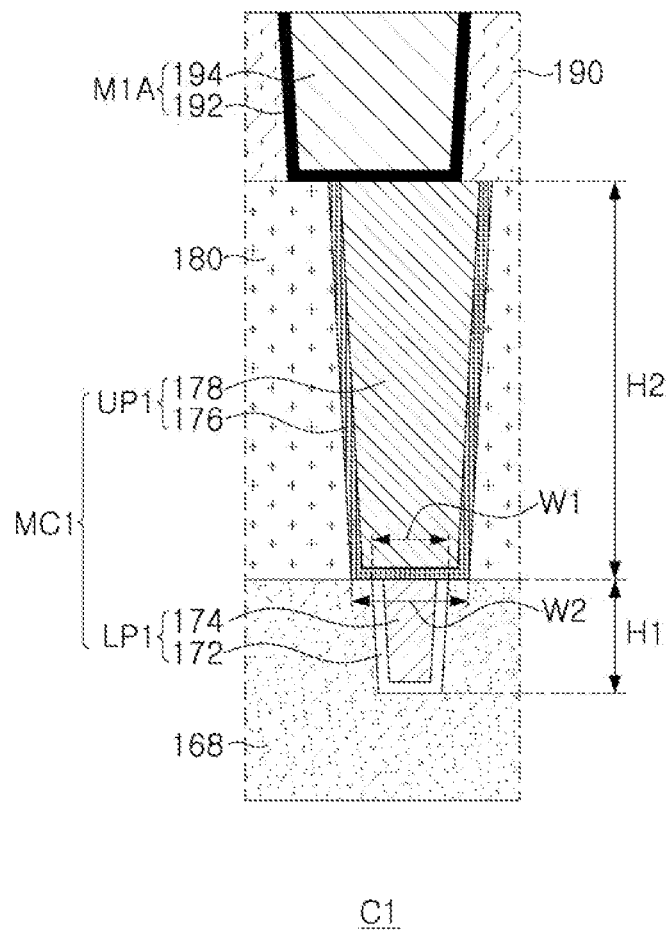
FIGS. 3A and 3B are partially enlarged cross-sectional views illustrating a partial region of a semiconductor device according to example embodiments.
Figure 3B:
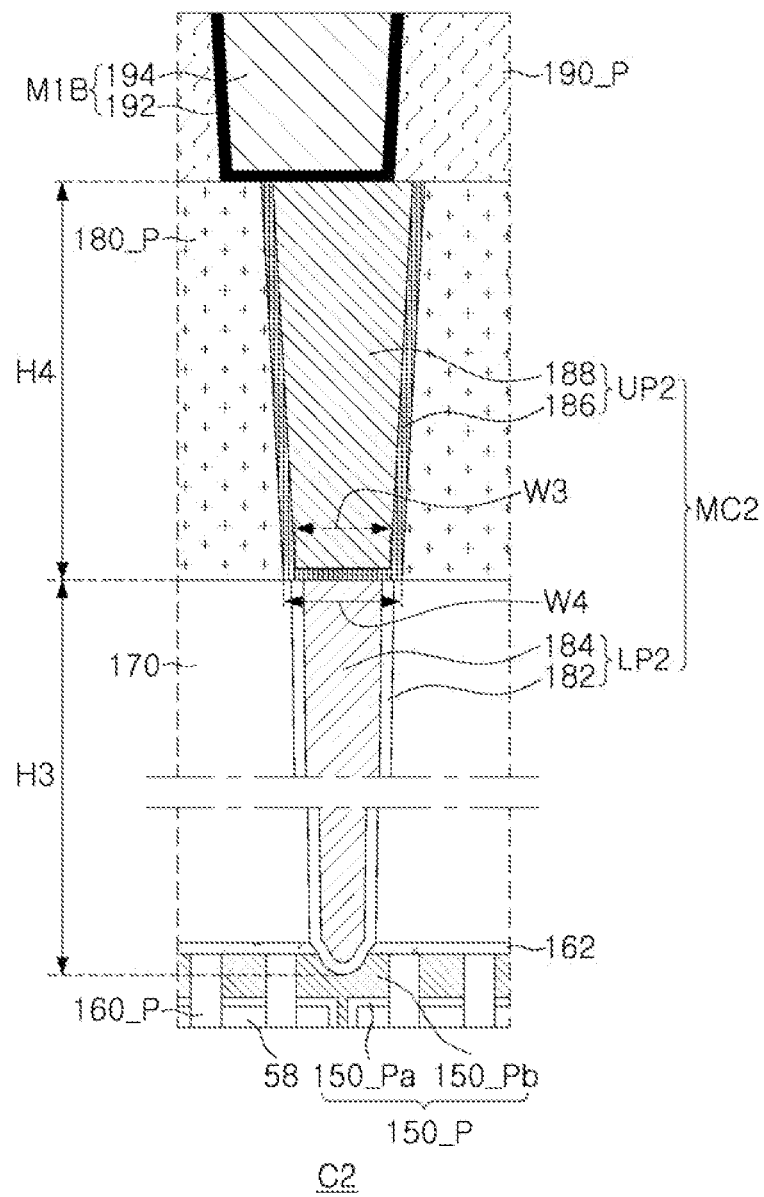

FIGS. 3A and 3B are partially enlarged cross-sectional views illustrating a partial region of a semiconductor device according to example embodiments. FIG. 3A is an enlarged view of region "C1" of FIG. 2, and FIG. 3B is an enlarged view of region "C2" of FIG. 2.

Referring to FIGS. 1A to 3B, a semiconductor device 100 may include a substrate 101 including a first region A1, e.g., a memory cell array region, and a second region A2, e.g., a peripheral circuit region, a first structure 1 on the first region A1 of the substrate 101, a second structure 2 on the second region A2 of the substrate 101, an information storage structure DS on the first structure 1, a contact structure MC1 on the information storage structure DS, a peripheral contact structure MC2 on the second structure 2, and wiring layers M1 on the contact structure MC1 and the peripheral contact structure MC2.

The first structure 1 may include, e.g., a cell array of a dynamic random access memory (DRAM). The first structure 1 may include cell active regions ACT, an isolation layer 110, a word line structure WLS, a bit line structure BLS, a spacer structure SS, a conductive contact 150, fence insulating patterns 151, a first insulating pattern 160, and an etch-stop layer 162.

The second structure 2 may include peripheral circuits for driving memory cells disposed in the cell array of the DRAM. The second structure 2 may include a peripheral active region ACT_P, a peripheral gate stack GS, a gate spacer SS_P, a circuit conductive contact 150_P, an insulating liner 52, and a second insulating pattern 160_P.

The information storage structure DS may include lower electrodes 164, a dielectric layer 166, an upper electrode 168, and support layers 165a and 165b. The lower electrodes 164, the dielectric layer 166, and the upper electrode 168 may be included in a capacitor.

The contact structure MC1 and the peripheral contact structure MC2 may have a double pillar structure in which a lower plug and an upper plug are stacked in two stacks, respectively. The contact structure MC1 may include a lower plug LP1 connected (e.g., electrically connected) to the upper electrode 168, and an upper plug UP1 on the lower plug LP1. The peripheral contact structure MC2 may include a peripheral lower plug LP2 connected to the circuit conductive contact 150_P and a peripheral upper plug UP2 on the peripheral lower plug LP2. Accordingly, structural stability of the contact structures may be improved to improve reliability, and it may be advantageous to have low electrical resistance to improve electrical properties. In addition, a difficulty level of a photo process and am etching process may be lowered. A detailed structure of each of the contact structure MC1 and the peripheral contact structure MC2 will be described below.

The substrate 101 may include a semiconductor material, e.g., a group IV semiconductor, a group III-V compound semiconductor, or a group II-VI compound semiconductor. In an implementation, the group IV semiconductor may include silicon, germanium, or silicon-germanium. In an implementation, the substrate 101 may further include impurities. The substrate 101 may be a silicon substrate, a silicon on insulator (SOI) substrate, a germanium substrate, a germanium on insulator (GOI) substrate, a silicon-germanium substrate, or a substrate including an epitaxial layer. As used herein, the term "or" is not an exclusive term, e.g., "A or B" would include A, B, or A and B.

The cell active regions ACT may be defined or limited in the substrate 101 by the isolation layer 110. The cell active region ACT may have a bar shape, and may have an island shape extending in one direction in the substrate 101. The one direction may be a direction inclined with respect to a direction of extension of the word lines WL and the bit lines BL. The cell active regions ACT may be parallel to each other, and an end of one cell active region ACT may be adjacent to a central portion of another cell active region ACT adjacent thereto.

The cell active region ACT may have first and second impurity regions 105a and 105b having a predetermined depth from an upper surface of the substrate 101. The first and second impurity regions 105a and 105b may be spaced apart from each other. The first and second impurity regions 105a and 105b may serve as source/drain regions of a transistor formed by the word line WL. The source region and the drain region may be formed by the first and second impurity regions 105a and 105b by doping or ion implantation of substantially the same impurities, and may be interchangeably referred to depending on a circuit configuration of a finally formed transistor. The impurities may include dopants having a conductivity type opposite to that of the substrate 101. In an implementation, depths of the first and second impurity regions 105a and 105b in the source region and the drain region may be different from each other.

The isolation layer 110 may be formed by a shallow trench isolation (STI) process. The isolation layer 110 may surround the cell active regions ACT and electrically isolate the cell active regions ACT from each other. The isolation layer 110 may be formed of an insulating material, e.g., silicon oxide, silicon nitride, or a combination thereof. The isolation layer 110 may include a plurality of regions having different lower end depths depending on a width of a trench with which the substrate 101 is etched.

The word line structures WLS may be in gate trenches 115 extending in the substrate 101. Each of the word line structures WLS may include a gate dielectric layer 120, a word line WL, and a gate capping layer 125. Herein, the gate dielectric layer 120 and WL may be referred to as a structure including the gate dielectric layer 120 and the word line WL, the word line WL may be referred to as a "gate electrode," and the word line structure WLS may be referred to as a "gate structure."

The word line WL may extend in a first direction X across the cell active region ACT. In an implementation, a pair of adjacent word lines WL may cross one cell active area ACT. In an implementation, the word line WL may be included in a gate of a buried channel array transistor (BCAT). In an implementation, the word lines WL may have a shape on the substrate 101. The word line WL may be below the gate trench 115 to have a predetermined thickness. The upper surface of the word line WL may be positioned on a level lower than that of the upper surface of the substrate 101. The high and low of the term "level" used herein may be defined based on (e.g., a distance in the Z direction from) a substantially flat upper surface of the substrate 101.

The word line WL may be formed of a conductive material, e.g., polycrystalline silicon (Si), titanium (Ti), titanium nitride (TiN), tantalum (Ta), tantalum nitride (TaN), tungsten (W), tungsten nitride (WN), or aluminum (Al). In an implementation, the word line WL may include a lower pattern and an upper pattern formed of different materials. The lower pattern may include, e.g., tungsten (W), titanium (Ti), tantalum (Ta), tungsten nitride (WN), titanium nitride (TiN), or tantalum nitride (TaN), and the upper pattern may be a semiconductor pattern including polysilicon doped with P-type or N-type impurities.

The gate dielectric layer 120 may be on bottom and inner surfaces of the gate trench 115. The gate dielectric layer 120 may conformally cover an inner wall of the gate trench 115. The gate dielectric layer 120 may include, e.g., silicon oxide, silicon nitride, or silicon oxynitride. The gate dielectric layer 120 may be, e.g., a silicon oxide film or a high-κ insulating film. In an implementation, the gate dielectric layer 120 may be a layer formed by oxidizing the cell active region ACT or a layer formed by deposition.

The gate capping layer 125 may fill the gate trench 115 on the word line WL. An upper surface of the gate capping layer 125 may be positioned on a level substantially same as that of the upper surface of the substrate 101. The gate capping layer 125 may be formed of an insulating material, e.g., silicon nitride.

The bit line structure BLS may extend in a direction, perpendicular to the word line WL, e.g., a second direction Y. The bit line structure BLS may include a bit line BL and a bit line capping pattern BC on the bit line BL.

The bit line BL may include a first conductive pattern 141, a second conductive pattern 142, and a third conductive pattern 143 sequentially stacked. The bit line capping pattern BC may be on the third conductive pattern 143. A buffer insulating layer 128 may be between the first conductive pattern 141 and the substrate 101, and a portion of the first conductive pattern 141 (hereinafter, referred to as a bit line contact pattern DC) may be in contact with the first impurity region 105a of the cell active region ACT. The bit line BL may be electrically connected to the first impurity region 105a through the bit line contact pattern DC. A lower surface of the bit line contact pattern DC may be positioned on a level lower than that of the upper surface of the substrate 101, and may be positioned on a level higher than that of the upper surface of the word line WL. In an implementation, the bit line contact pattern DC may be in the substrate 101 to be locally in the bit line contact hole 135 exposing the first impurity region 105a.

The first conductive pattern 141 may include a semiconductor material, e.g., polycrystalline silicon. The first conductive pattern 141 may be in direct contact with the first impurity region 105a. The second conductive pattern 142 may include a metal-semiconductor compound. The metal-semiconductor compound may be, e.g., a layer obtained by silicidizing a portion of the first conductive pattern 141. In an implementation, the metal-semiconductor compound may include cobalt silicide (CoSi), titanium silicide (TiSi), nickel silicide (NiSi), tungsten silicide (WSi), or another metal silicide. The third conductive pattern 143 may include a metal material, e.g., titanium (Ti), tantalum (Ta), tungsten (W), or aluminum (Al). In an implementation, the number of conductive patterns included in the bit line BL, a type of material, and/or a stacking order may be changed in various manners.

The bit line capping pattern BC may include a first capping pattern 146, a second capping pattern 147, and a third capping pattern 148 being sequentially stacked on the third conductive pattern 143. The first to third capping patterns 146, 147, and 148 may respectively include an insulating material, e.g., a silicon nitride film. The first to third capping patterns 146, 147, and 148 may be formed of different materials. Even through the first to third capping patterns 146, 147, and 148 include the same material, the first to third capping patterns 146, 147, and 148 may be distinguished from one another by a difference in physical properties. A thickness of the second capping pattern 147 may be less than a thickness of the first capping pattern 146 and a thickness of the third capping pattern 148, respectively. In an implementation, the number of capping patterns and/or a type of material included in the bit line capping pattern BC may be changed in various manners.

Spacer structures SS may be on opposite sidewalls of each of the bit line structures BLS to extend in a direction, e.g., a Y-direction. The spacer structures SS may be between the bit line structure BLS and the conductive contact 150. The spacer structures SS may extend along sidewalls of the bit line BL and sidewalls of the bit line capping pattern BC. A pair of spacer structures SS on opposite sides of one bit line structure BLS may have an asymmetric shape with respect to the bit line structure BLS. Each of the spacer structures SS may include a plurality of spacer layers, and may further include an air spacer in some example embodiments.

The conductive contact 150 may be connected to a region of the cell active region ACT, e.g., the second impurity region 105b. The conductive contact 150 may electrically connect the second impurity region 105b of the cell active region ACT and the information storage structure DS to each other. The conductive contact 150 may include, e.g., a lower conductive pattern 152, a metal-semiconductor compound layer 154, and an upper conductive pattern 156. In an implementation, the conductive contact 150 may include only one barrier pattern and one conductive pattern surrounded by the barrier pattern.

The lower conductive pattern 152 may be between the bit lines BL and between the word lines WL. The lower conductive pattern 152 may pass through the buffer insulating layer 128 and be connected to the second impurity region 105b of the cell active region ACT. The lower conductive pattern 152 may be in direct contact with the second impurity region 105b. A lower surface of the lower conductive pattern 152 may be positioned on a level lower than that of the upper surface of the substrate 101, and may be positioned on a level higher than that of the lower surface of the bit line contact pattern DC. The lower conductive pattern 152 may be insulated from the bit line contact pattern DC by the spacer structure SS. The lower conductive pattern 152 may include a conductive material, e.g., polycrystalline silicon (Si), titanium (Ti), titanium nitride (TiN), tantalum (Ta), tantalum nitride (TaN), tungsten (W), tungsten nitride (WN), or aluminum (Al). In an implementation, the lower conductive pattern 152 may include a plurality of layers.

The metal-semiconductor compound layer 154 may be between the lower conductive pattern 152 and the upper conductive pattern 156. The metal-semiconductor compound layer 154 may be, e.g., a layer obtained by silicidizing a portion of the lower conductive pattern 152, when the lower conductive pattern 152 includes a semiconductor material. The metal-semiconductor compound layer 154 may include, e.g., cobalt silicide (CoSi), titanium silicide (TiSi), nickel silicide (NiSi), tungsten silicide (WSi), or another metal silicide. In an implementation, the metal-semiconductor compound layer 154 may be omitted.

The upper conductive pattern 156 may be on the lower conductive pattern 152. The upper conductive pattern 156 may extend between the spacer structures SS to cover an upper surface of the metal-semiconductor compound layer 154. The upper conductive pattern 156 may include a barrier pattern 156a and a conductive pattern 156b. The barrier pattern 156a may cover a lower surface and side surfaces of the conductive pattern 156b. The barrier pattern 156a may include a metal or a metal nitride, e.g., titanium (Ti), titanium nitride (TiN), tantalum (Ta), tantalum nitride (TaN), or tungsten nitride (WN). The conductive pattern 156b may include a conductive material, e.g., polycrystalline silicon (Si), titanium (Ti), tantalum (Ta), tungsten (W), ruthenium (Ru), copper (Cu), molybdenum (Mo), platinum (Pt), nickel (Ni), cobalt (Co), aluminum (Al), titanium nitride (TiN), tantalum nitride (TaN), or tungsten nitride (WN).

The fence insulating patterns 151 may be on a side surface of the conductive contact 150. The fence insulating patterns 151 may be spaced apart from each other in the Y-direction between the bit line structures BLS. The fence insulating patterns 151 may vertically overlap the word line structures WLS. In a plan view, the fence insulating patterns 151 may be between the bit line structures BLS in an X-direction and between the conductive contacts 150 in the Y-direction.

The first insulating pattern 160 may pass through the upper conductive pattern 156 of the conductive contact 150. The upper conductive pattern 156 may be divided into a plurality of upper conductive patterns by the first insulating pattern 160. The first insulating pattern 160 may include an insulating material, e.g., silicon oxide, silicon nitride, or silicon oxynitride.

The etch-stop layer 162 may cover the first insulating pattern 160 between the lower electrodes 164. The etch-stop layer 162 may be in contact with lower regions of side surfaces of the lower electrodes 164. The etch-stop layer 162 may include, e.g., silicon nitride or silicon oxynitride.

The lower electrodes 164 may be on the conductive contacts 150. The lower electrodes 164 may pass through the etch-stop layer 162 and be in contact with the conductive contacts 150. The lower electrodes 164 may have a cylindrical shape or a hollow cylinder or cup shape. At least one of support layers 171 supporting the lower electrodes 164 may be between adjacent lower electrodes 164. The lower electrodes 164 may include a doped semiconductor material, a conductive metal nitride, a metal, or a conductive metal oxide. The lower electrodes 164 may include, e.g., Ti, TiN, TiAlN, TiCN, Ta, TaN, TaAlN, TaCN, Ru, Nb, Mo, Sn, In, Ni, Co, W, Zr, Hf, Pt, or combinations thereof.

The support layers 165*a* and 165*b* may include a first support layer 165*a* and a second support layer 165*b* on the first support layer 165*a*. The support layers 165*a* and 165*b* may be in contact with the lower electrodes 164, and extend in a direction, parallel to the upper surface of the substrate 101. In an implementation, the second support layer 165*b* may have a thickness greater than that of the first support layer 165*a*. The support layers 165*a* and 165*b* may be layers supporting the lower electrodes 164 having a high aspect ratio. Each of the support layers 165*a* and 165*b* may include, e.g., silicon nitride, silicon oxynitride, or a material similar thereto. The number, thickness, and/or arrangement relationship of the support layers 165*a* and 165*b* may be changed in various manners in some example embodiments.

A dielectric layer 166 may be on the lower electrodes 164. The dielectric layer 166 may have a uniform thickness on surfaces of the lower electrodes 164. The dielectric layer 166 may include a high dielectric material or silicon oxide, silicon nitride, silicon oxynitride, or combinations thereof. In an implementation, the dielectric layer 166 may include an oxide, nitride, silicide, oxynitride, or silicified oxynitride including at least one of Hf, Al, Zr, and La.

The upper electrode 168 may be on the dielectric layer 166. The upper electrode 168 may include a conductive material, e.g., a doped semiconductor material, a conductive metal nitride, a metal, a conductive metal oxide, conductive carbon, or combinations thereof. The upper electrode 168 may include a semiconductor alloy such as SiGe.

The lower plug LP1 may be buried in the upper electrode 168. The lower plug LP1 may have inclined side surfaces, e.g., may have a width becoming narrower from an upper portion thereof to a lower portion thereof. As illustrated in FIG. 3A, an upper surface of the lower plug LP1 may have a first width W1 (e.g., in the X-direction), and the lower plug LP1 may have a first height H1 in a vertical direction (e.g., Z-direction). The upper surface of the lower plug LP1 may be substantially coplanar with an upper surface of the upper electrode 168. The upper surface of the lower plug LP1 may be substantially coplanar with an upper surface of the peripheral lower plug LP2.

The lower plug LP1 may include a lower barrier layer 172 and a lower conductive layer 174 on or in the lower barrier layer 172. The lower barrier layer 172 may surround a lower surface and side surfaces of the lower conductive layer 174. At least one of an upper surface of the lower barrier layer 172 and an upper surface of the lower conductive layer 174 may be substantially coplanar with the upper surface of the upper electrode 168. The lower barrier layer 172 may include a metal or a metal nitride, e.g., titanium (Ti), titanium nitride (TiN), tantalum (Ta), tantalum nitride (TaN), or tungsten nitride (WN). The lower conductive layer 174 may be formed of a conductive material, e.g., polycrystalline silicon (Si), titanium (Ti), tantalum (Ta), tungsten (W), ruthenium (Ru), copper (Cu), molybdenum (Mo), platinum (Pt), nickel (Ni), cobalt (Co), aluminum (Al), titanium nitride (TiN), tantalum nitride (TaN), or tungsten nitride (WN).

The upper plug UP1 may be on the lower plug LP1 and may be connected to a wiring layer M1. The upper plug UP1 may pass through a first upper insulating layer 180 on the upper electrode 168. The upper plug UP1 may have inclined side surfaces, e.g., may have a width becoming narrower from an upper portion thereof to a lower portion thereof. As illustrated in FIG. 3A, a lower surface of the upper plug UP1 may have a second width W2, and the upper plug UP1 may have a second height H2 in the vertical direction. The first width W1 may be narrower than the second width W2, and the first height H1 may be less than the second height H2. The second width W2 may be wider than the first width W1, thereby securing a contact margin between the lower plug LP1 and the upper plug UP1. The lower surface of the upper plug UP1 may be in contact (e.g., direct contact) with the upper surface of the lower plug LP1.

The upper plug UP1 may include an upper barrier layer 176 and an upper conductive layer 178 on or in the upper barrier layer 176. The upper barrier layer 176 may surround a lower surface and side surfaces of the upper conductive layer 178. The upper barrier layer 176 may be in contact (e.g., direct contact) with the upper surface of the upper electrode 168 and the lower barrier layer 172 and the lower conductive layer 174. The upper barrier layer 176 may include the metals or metal nitrides described above. The upper conductive layer 178 may include the conductive material described above.

The peripheral active region ACT_P may be defined or limited in the substrate 101 by a peripheral isolation layer 110_P. Peripheral source/drain regions 30 may be on opposite sides of a peripheral circuit gate stack GS in the peripheral active region ACT_P. The peripheral source/drain regions 30 may include impurity regions. The peripheral isolation layer 110_P may include a first insulating layer 111 and a second insulating layer 112. The second insulating layer 112 may include a material different from that of the first insulating layer 111.

The peripheral gate stack GS may include a peripheral gate dielectric layer 40, peripheral gate electrodes 41, 42, and 43, and a gate capping layer 46. The peripheral gate dielectric layer 40 may be between the peripheral active region ACT_P and the peripheral gate electrodes 41, 42, and 43. The peripheral gate dielectric layer 40 may include silicon oxide, silicon nitride, or a high-κ material. The high-κ material may refer to a dielectric material having a dielectric constant higher than that of silicon oxide. In an implementation, the peripheral gate electrodes 41, 42, and 43 may have a structure and material similar to those of the bit line BL.

The gate spacer SS_P may be on a side surface of the peripheral gate stack GS. The gate spacer SS_P may include a plurality of spacer layers. The insulating liner 52 may cover the peripheral gate stack GS and the gate spacer SS_P.

The circuit conductive contact 150_P may pass through interlayer insulating layers 56 and 58 and the insulating liner 52 and be connected to the peripheral source/drain regions 30. The circuit conductive contact 150_P may be on the peripheral active region ACT_P and electrically connected to the peripheral active region ACT_P. The circuit conductive contact 150_P may include a plug portion and a wiring portion on the plug portion. The circuit conductive contact 150_P may include a peripheral barrier pattern 150_Pa and a peripheral conductive pattern 150_Pb on the peripheral barrier pattern 150_Pa. The second insulating pattern 160_P may pass through the wiring portion of the circuit conductive contact 150_P. The wiring portion may be divided into a plurality of wiring portions by the second insulating pattern 160_P. The wiring portion may be connected to the peripheral contact structure MC2.

The peripheral lower plug LP2 may pass through a peripheral insulating layer 170 on the circuit conductive contact 150_P. The peripheral lower plug LP2 may partially recess or penetrate into the circuit conductive contact 150_P and be connected to the circuit conductive contact 150_P. The peripheral lower plug LP2 may have inclined side surfaces, e.g., may have a width becoming narrower from an upper portion thereof to a lower portion thereof. As illustrated in FIG. 3B, the upper surface of the peripheral lower plug LP2 may have a third width W3, and the peripheral lower plug LP2 may have a third height H3 higher than the first height H1 in the vertical direction. The upper surface of the peripheral lower plug LP2 may be substantially coplanar with an upper surface of a first peripheral insulating layer 170.

The peripheral lower plug LP2 may include a peripheral lower barrier layer 182 and a peripheral lower conductive layer 184 on the peripheral lower barrier layer 182. The peripheral lower barrier layer 182 may surround a lower surface and side surfaces of the peripheral lower conductive layer 184. At least one of an upper surface of the peripheral lower barrier layer 182 and an upper surface of the peripheral lower conductive layer 184 may be substantially coplanar with an upper surface of a first peripheral upper insulating layer 180_P. The peripheral lower barrier layer 182 may include the metals or metal nitrides described above. The peripheral lower conductive layer 184 may include the conductive material described above.

The peripheral upper plug UP2 may pass through the first peripheral upper insulating layer 180_P on the peripheral insulating layer 170. The peripheral upper plug LP2 may be (e.g., electrically) connected to the wiring layer M1. The peripheral upper plug UP2 may have inclined side surfaces, e.g., may have a width becoming narrower from an upper portion thereof to a lower portion thereof. As illustrated in FIG. 3B, a lower surface of the peripheral upper plug UP2 may have a fourth width W4, and the peripheral upper plug UP2 may have a fourth height H4 in a vertical direction. The third width W3 may be narrower than the fourth width W4, and the third height H3 may be higher than the fourth height H4. The fourth height H4 may be substantially equal to the second height H2. The lower surface of the peripheral upper plug UP2 may be in (e.g., direct) contact with the upper surface of the peripheral lower plug LP2.

The peripheral upper plug UP2 may include a peripheral upper barrier layer 186 and a peripheral upper conductive layer 188 on the peripheral upper barrier layer 186. The peripheral upper barrier layer 186 may surround a lower surface and side surfaces of the peripheral upper conductive layer 188. The peripheral upper barrier layer 186 may be in (e.g., direct) contact with the peripheral lower barrier layer 182 and the peripheral lower conductive layer 184. The peripheral upper barrier layer 186 may include the metals or metal nitrides described above. The peripheral upper conductive layer 188 may include the conductive material described above.

The wiring layers M1 may extend, e.g., in the X-direction. The wiring layers M1 may include a first wiring layer M1A connected to the contact structure MC1 and a second wiring layer M1B connected to the peripheral contact structure MC2. The first wiring layer M1A may pass through a second upper insulating layer 190 on the first upper insulating layer 180. The second wiring layer M1B may pass through a second peripheral upper insulating layer 190_P on the first peripheral upper insulating layer 180_P.

Each of the wiring layers M1 may include a barrier layer 192 and a conductive layer 194 on the barrier layer 192. The barrier layer 192 may surround a lower surface and side surfaces of the conductive layer 194. The barrier layer 192 may include the metals or metal nitrides described above. The conductive layer 194 may include the conductive material described above.

FIGS. 4A to 4E are partially enlarged cross-sectional views illustrating a partial region of a semiconductor device according to example embodiments. FIGS. 4A to 4E illustrate a region corresponding to region "C1" of FIG. 2.

Figure 4A:
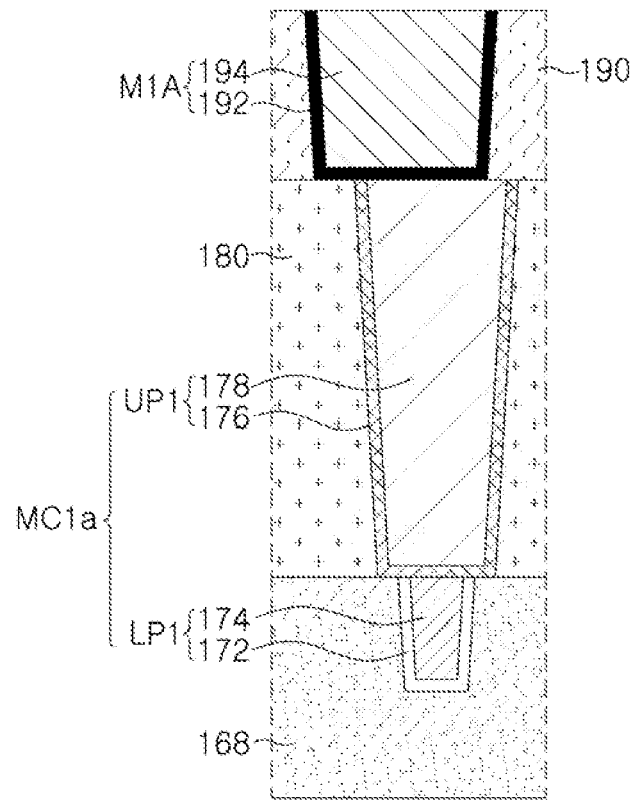
FIGS. 4A to 4E are partially enlarged cross-sectional views illustrating a partial region of a semiconductor device according to example embodiments.

Referring to FIG. 4A, in a contact structure MC1*a*, the upper barrier layer 176 may include a material different from that of the lower barrier layer 172, and the upper conductive layer 178 may include a material different from that of the lower conductive layer 174. In an implementation, the lower barrier layer 172 may include Ti/TiN, and the upper barrier layer 176 may include Ta/TaN. In an implementation, the lower conductive layer 174 may include W, and the upper conductive layer 178 may include Cu.

Figure 4B:
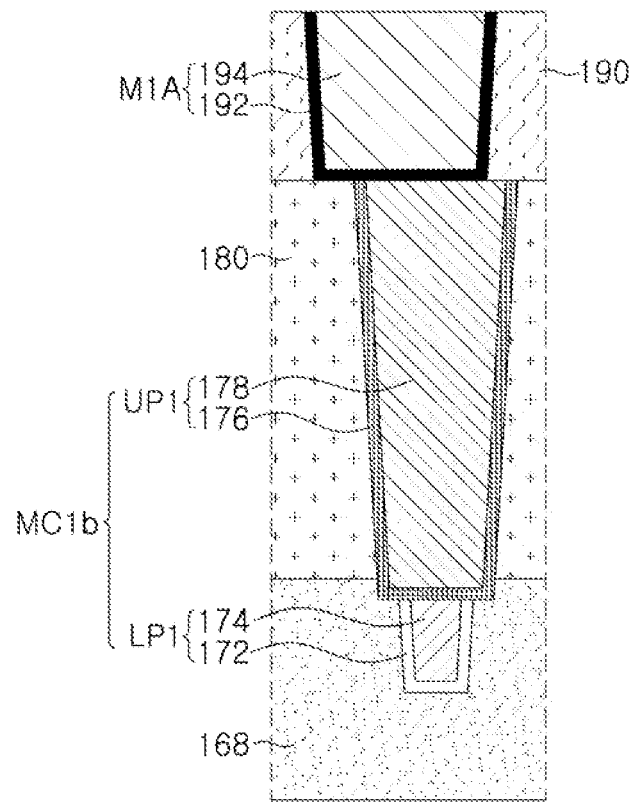

Referring to FIG. 4B, in a contact structure MC1*b*, the upper plug UP1 may penetrate the upper electrode 168 and the lower plug LP1. In an implementation, a lower surface of the upper plug UP1 may be positioned on a level lower than that of an upper surface of the upper electrode 168, and a portion of the upper barrier layer 176 may be in (e.g., direct) contact with an upper surface of the plug LP1 on the level lower than that of the upper surface of the upper electrode 168.

Figure 4C:
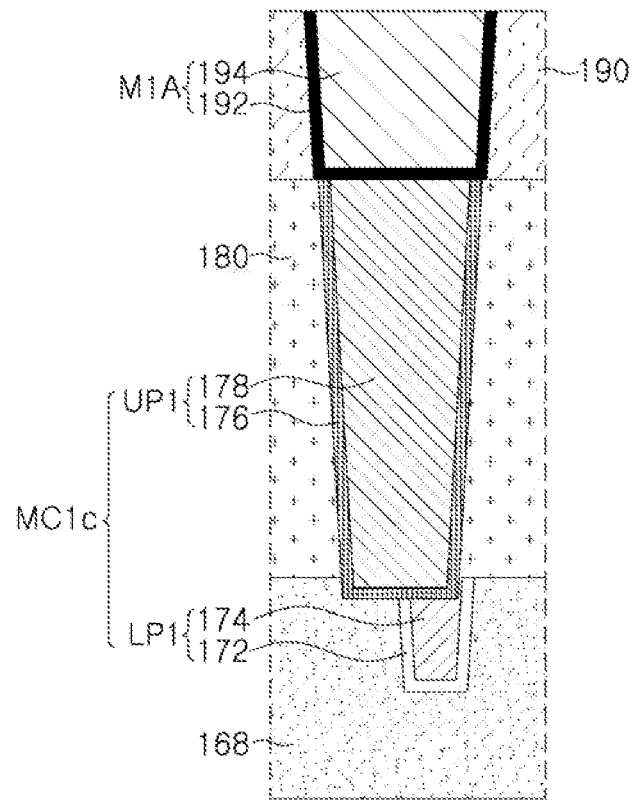

Referring to FIG. 4C, in a contact structure MC1*c*, a central axis of the upper plug UP1 and a central axis of the lower plug LP1 may not be aligned in a direction (e.g., Z-direction). Even when the central axis of the upper plug UP1 is shifted from the central axis of the lower plug LP1, the upper plug UP1 may be connected to the lower plug LP1 due to the second width W2 wider than the first width W1.

Figure 4D:
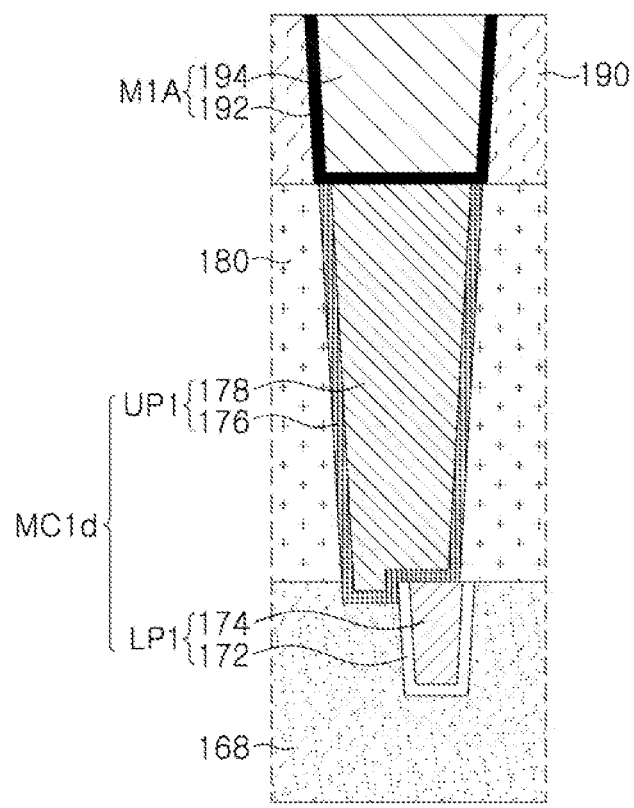

Referring to FIG. 4D, in a contact structure MC1*d*, a lower portion of the upper plug UP1 may have a bent or stepped shape. In an implementation, the upper plug UP1 may include a first portion in contact with an upper surface of the lower plug LP1 and a second portion extending along a side surface of the lower plug LP1 and penetrating the upper electrode 168. The second portion may be positioned on a level lower than that of the first portion.

Figure 4E:
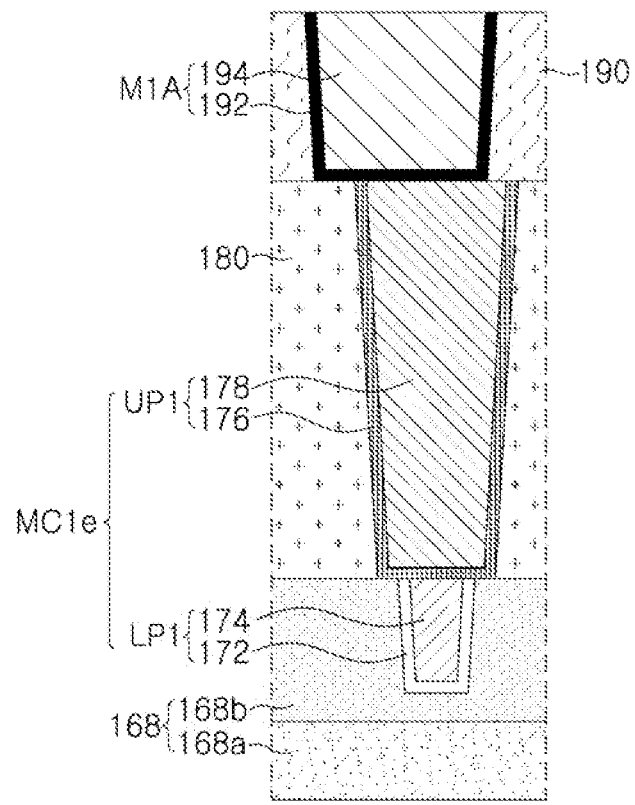

Referring to FIG. 4E, the upper electrode 168 may include a first electrode layer 168*a* and a second electrode layer 168*b* on the first electrode layer 168a, and the lower plug LP1 of a contact structure MC1e may be buried in the second electrode layer 168b. The second electrode layer 168b may include a material different from that of the first electrode layer 168a. In an implementation, the second electrode layer 168b may include a metal material, and the first electrode layer 168a may include a doped semiconductor compound. In an implementation, the first electrode layer 168a may include SiGe, and the second electrode layer 168b may include W.

FIGS. 5A to 5D are partially enlarged cross-sectional views illustrating a partial region of a semiconductor device according to example embodiments. FIGS. 5A to 5D illustrate a region corresponding to region "C2" of FIG. 2.

Figure 5A:
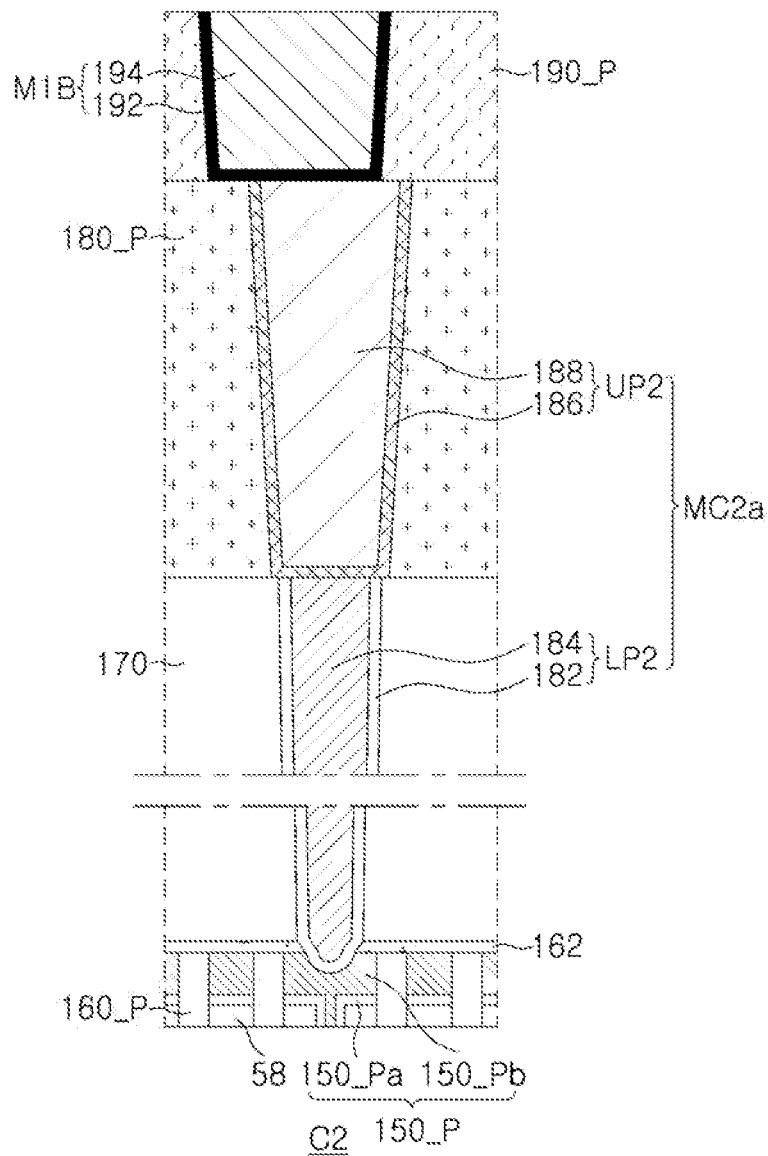
FIGS. 5A to 5D are partially enlarged cross-sectional views illustrating a partial region of a semiconductor device according to example embodiments.

Referring to FIG. 5A, in a peripheral contact structure MCa, the peripheral upper barrier layer 186 may include a material different from that of the peripheral lower barrier layer 182, and the peripheral upper conductive layer 188 may include a material different from that of the peripheral lower conductive layer 184. In an implementation, the peripheral lower barrier layer 182 may include Ti/TiN and the peripheral upper barrier layer 186 may include Ta/TaN. In an implementation, the peripheral lower conductive layer 184 may include W, and the peripheral upper conductive layer 188 may include Cu.

Figure 5B:
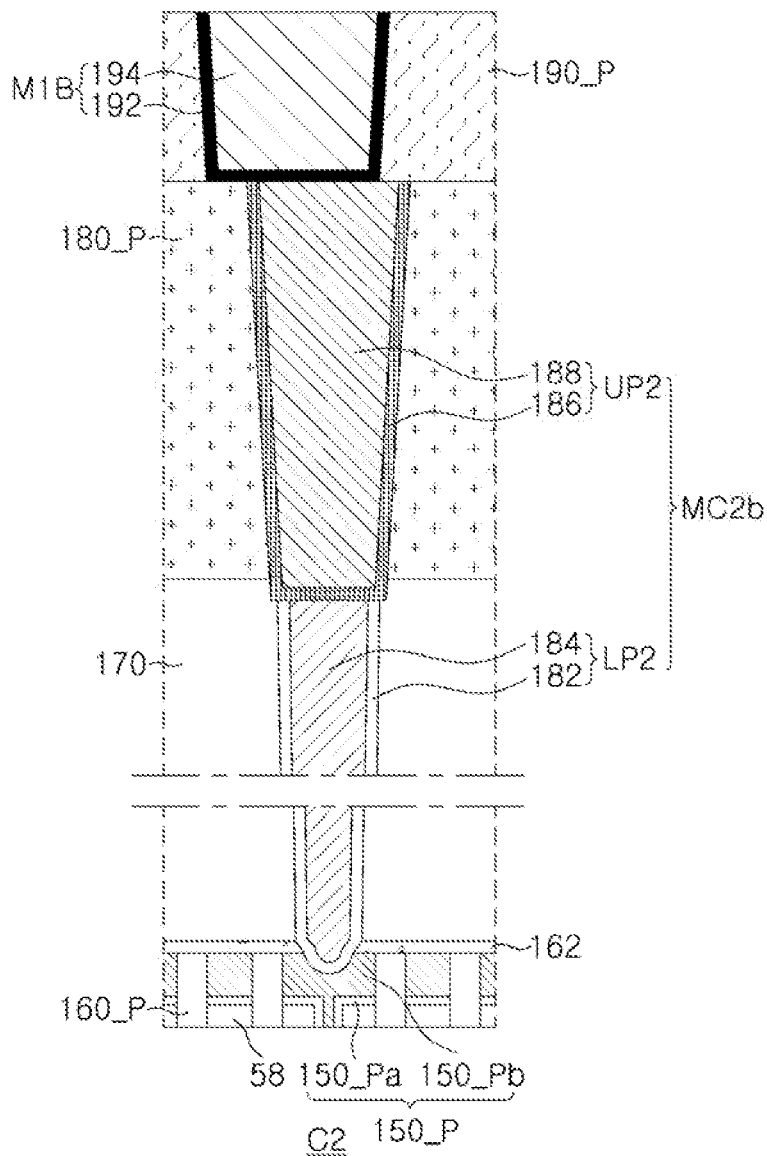

Referring to FIG. 5B, in a peripheral contact structure MCb, the peripheral upper plug UP2 may penetrate the peripheral lower plug LP2. In an implementation, a lower surface of the peripheral upper plug UP2 may be positioned on a level lower than that of an upper surface of the peripheral insulating layer 170, and a portion of the peripheral upper barrier layer 186 may be in contact with an upper surface of the peripheral lower plug LP2 on the level lower than that of the upper surface of the peripheral insulating layer 170.

Figure 5C:
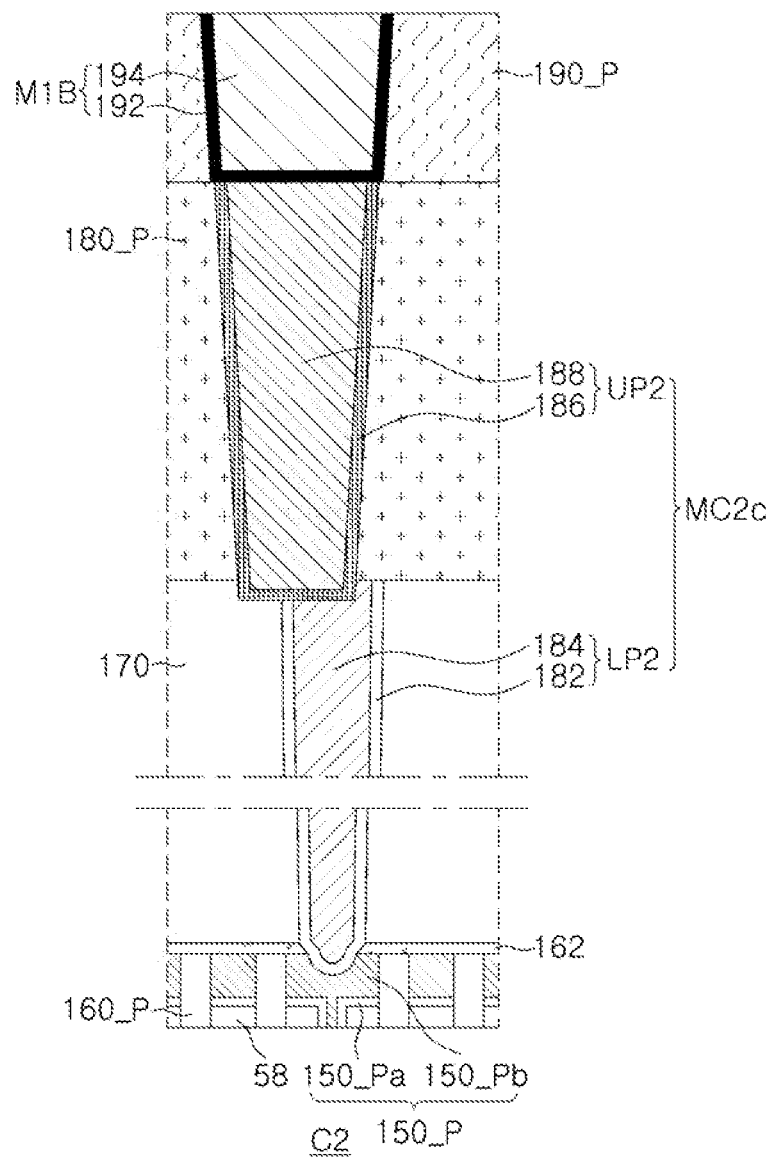

Referring to FIG. 5C, in a peripheral contact structure MCc, a central axis of the peripheral upper plug UP2 and a central axis of the peripheral lower plug LP2 may not be aligned in the vertical direction. Even when the central axis of the peripheral upper plug UP2 is shifted from the central axis of the peripheral lower plug LP2, the peripheral upper plug UP2 may be connected the peripheral lower plug LP2 due to the fourth width W4 wider than the third width W3.

Figure 5D:
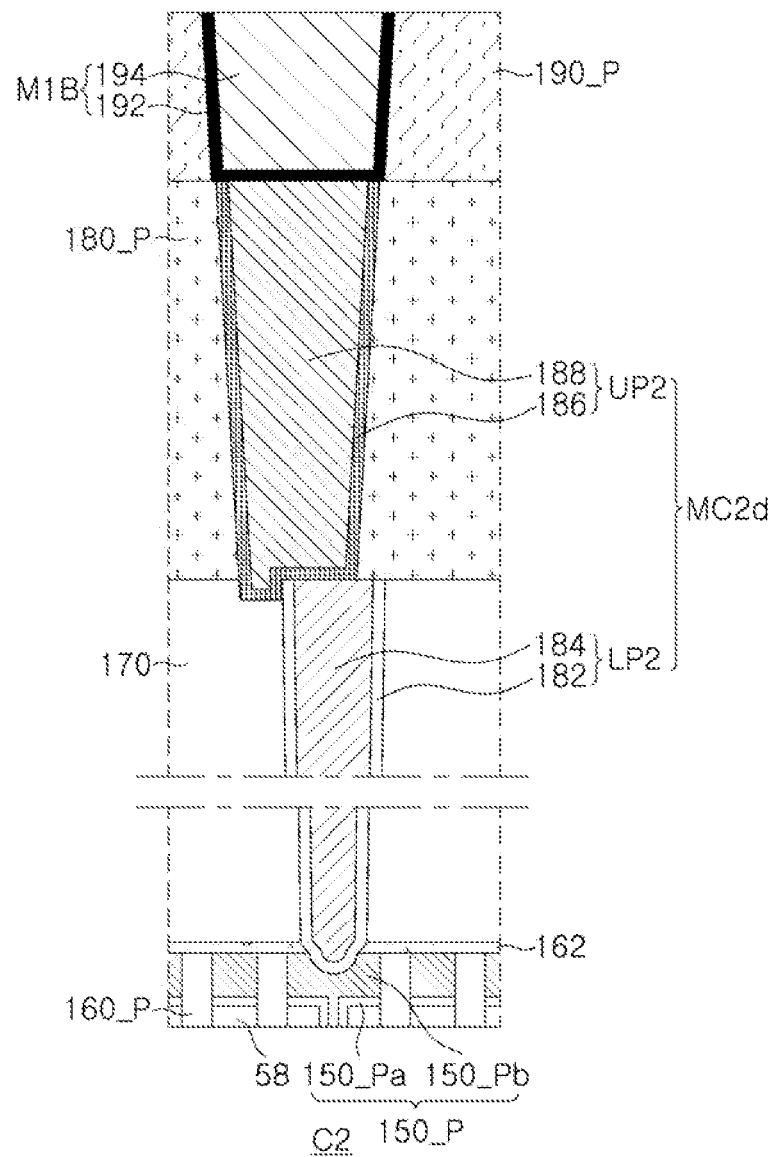

Referring to FIG. 5D, in a peripheral contact structure MCd, a lower portion of the peripheral upper plug UP2 may have a bent or stepped shape. In an implementation, the peripheral upper plug UP2 may include a first portion in contact with an upper surface of the peripheral lower plug LP2 and a second portion extending along a side surface of the peripheral lower plug LP2 and penetrating the peripheral insulating layer 170. The second portion may be positioned on a level lower than that of the first portion.

FIGS. 6 to 11 are cross-sectional views of stages in a method of manufacturing a semiconductor device according to example embodiments.

Figure 6:
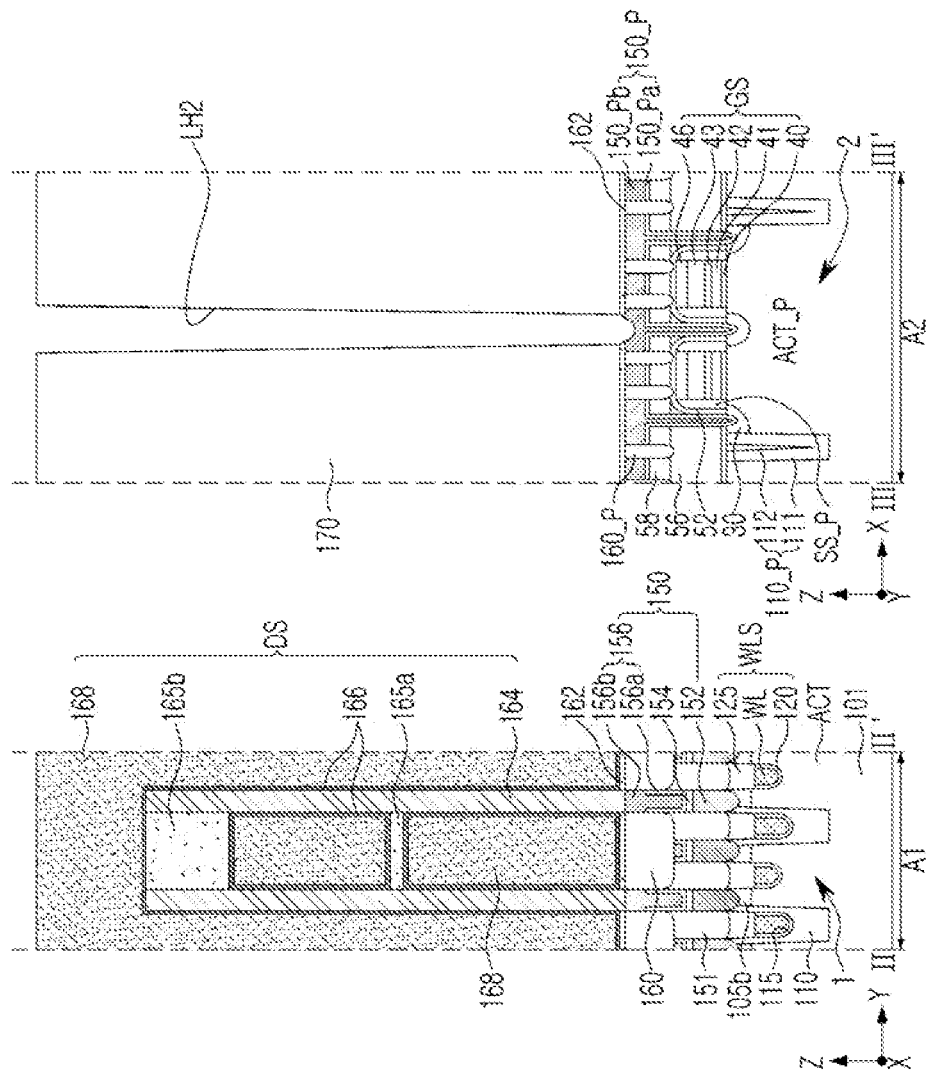
FIGS. 6 to 11 are cross-sectional views of stages in a method of manufacturing a semiconductor device according to example embodiments.

Referring to FIG. 6, first, the first structure 1 may be formed on the first region A1 of the substrate 101 and the second structure 2 may be formed on the second region A2 of the substrate 101. Then, the information storage structure DS may be formed on the first structure 1, and the peripheral insulating layer 170 may be formed on the second structure 2, and a lower contact hole LH1 and a peripheral lower contact hole LH2 may be formed.

Forming the first structure 1 may include forming the isolation layer 110 and the cell active region ACT on the substrate 101, forming the impurity regions 105a and 105b, forming the word line structure WLS after forming the gate trench 115, forming the bit line structure BLS on the substrate 101, forming the spacer structure SS on a side surface of the bit line structure BLS, forming the fence insulating patterns 151 between the spacer structures SS, forming the conductive contacts 150 between the fence insulating patterns 151, forming first insulating patterns 160 passing through a portion of the conductive contacts 150, and forming the etch-stop layer 162 on the first insulating patterns 160 and the conductive contacts 150.

Forming the second structure 2 may include forming the peripheral isolation layer 110_P and the peripheral active region ACT_P on the substrate 101, forming the peripheral gate stack GS on the peripheral active region ACT_P, forming the gate spacer SS_P on a side surface of the peripheral gate stack GS, forming the peripheral source/drain regions 30 on opposite sides of the peripheral gate stack GS in the peripheral active region ACT_P, forming the insulating liner 52 and the interlayer insulating layers 56 and 58 on the peripheral active region ACT_P, forming the circuit conductive contact 150_P connected to the peripheral source/drain regions ACT_P, and forming the second insulating pattern 160_P passing through a portion of the circuit conductive contact 150_P.

Forming the information storage structure DS on the first structure 1 may include forming the lower electrodes 164, forming the support layers 165a and 165b supporting the lower electrodes 164, forming the dielectric layer 166 on the lower electrodes 164, and forming the upper electrode 168 on the dielectric layer 166. Forming the lower electrodes 164 may include forming mold layers on the etch-stop layer 162, forming a plurality of holes passing through the mold layers and the etch-stop layer 162, and forming a conductive material in the plurality of holes.

The upper electrode 168 may be partially etched by forming a first mask layer on the information storage structure DS, and performing a photo process and an etching process. The lower contact hole LH1 passing through an upper region of the upper electrode 168 may be formed. The first mask layer may also be formed on the peripheral insulating layer 170 on the second structure 2. When the photo process and the etching process are performed, the peripheral lower contact hole LH2 passing through the peripheral insulating layer 170 may be formed. The peripheral lower contact hole LH2 may recess an upper portion of the circuit conductive contact 150_P. Thereafter, the first mask layer may be removed.

Figure 7:
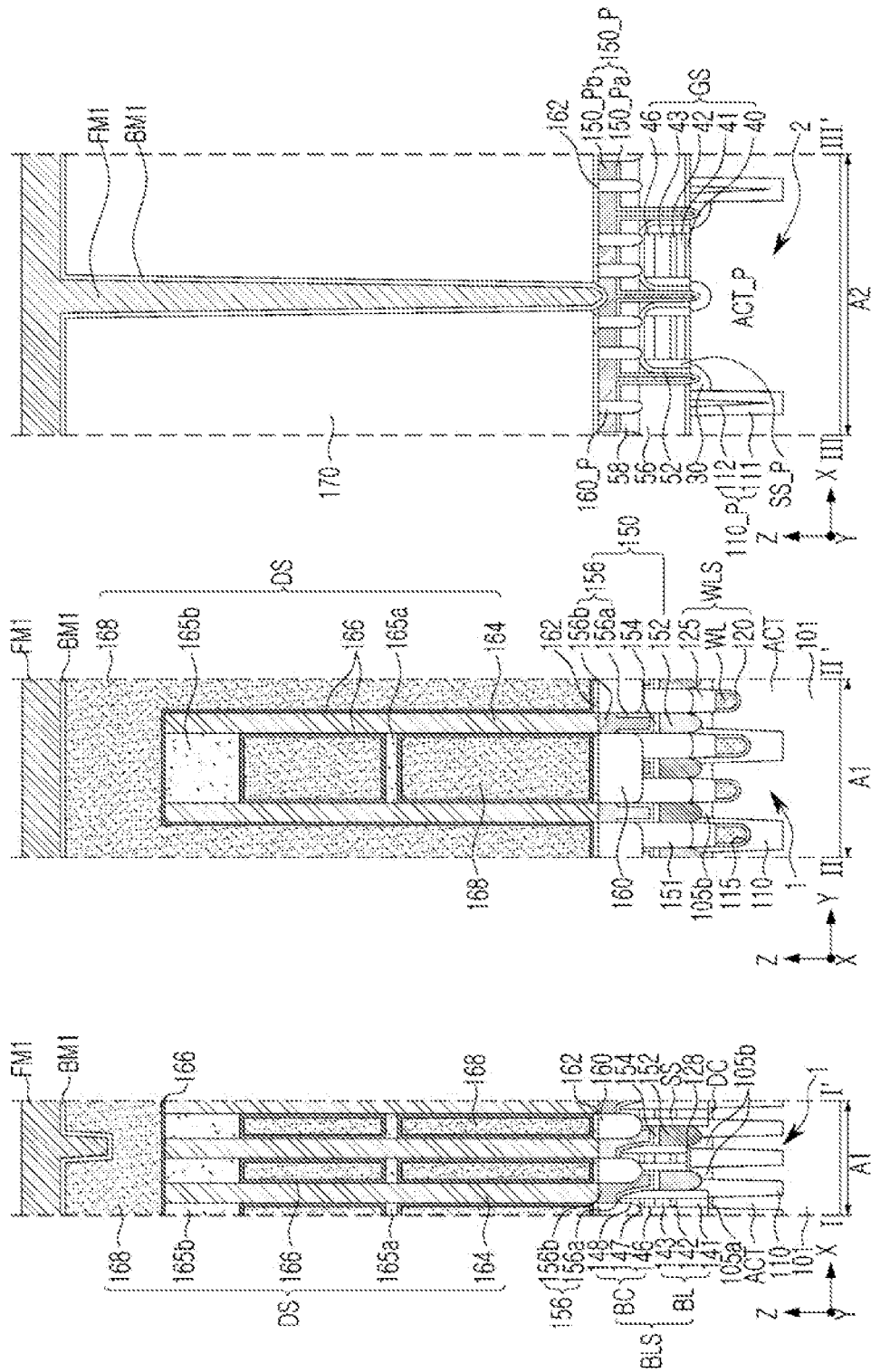

Referring to FIG. 7, a first barrier material layer BM1 and a first filling material layer FM1 may be sequentially formed on the lower contact hole LH1 and the peripheral lower contact hole LH2.

The first barrier material layer BM1 may cover an inner surface and a lower surface of the lower contact hole LH1 and an upper surface of the upper electrode 168 with a uniform thickness. The first barrier material layer BM1 may cover an inner surface and a lower surface of the peripheral lower contact hole LH2 and an upper surface of the peripheral insulating layer 170 with a uniform thickness. The first filling material layer FM1 may cover the first barrier material layer BM1 and may fill the lower contact hole LH1 and the peripheral lower contact hole LH2.

Figure 8:
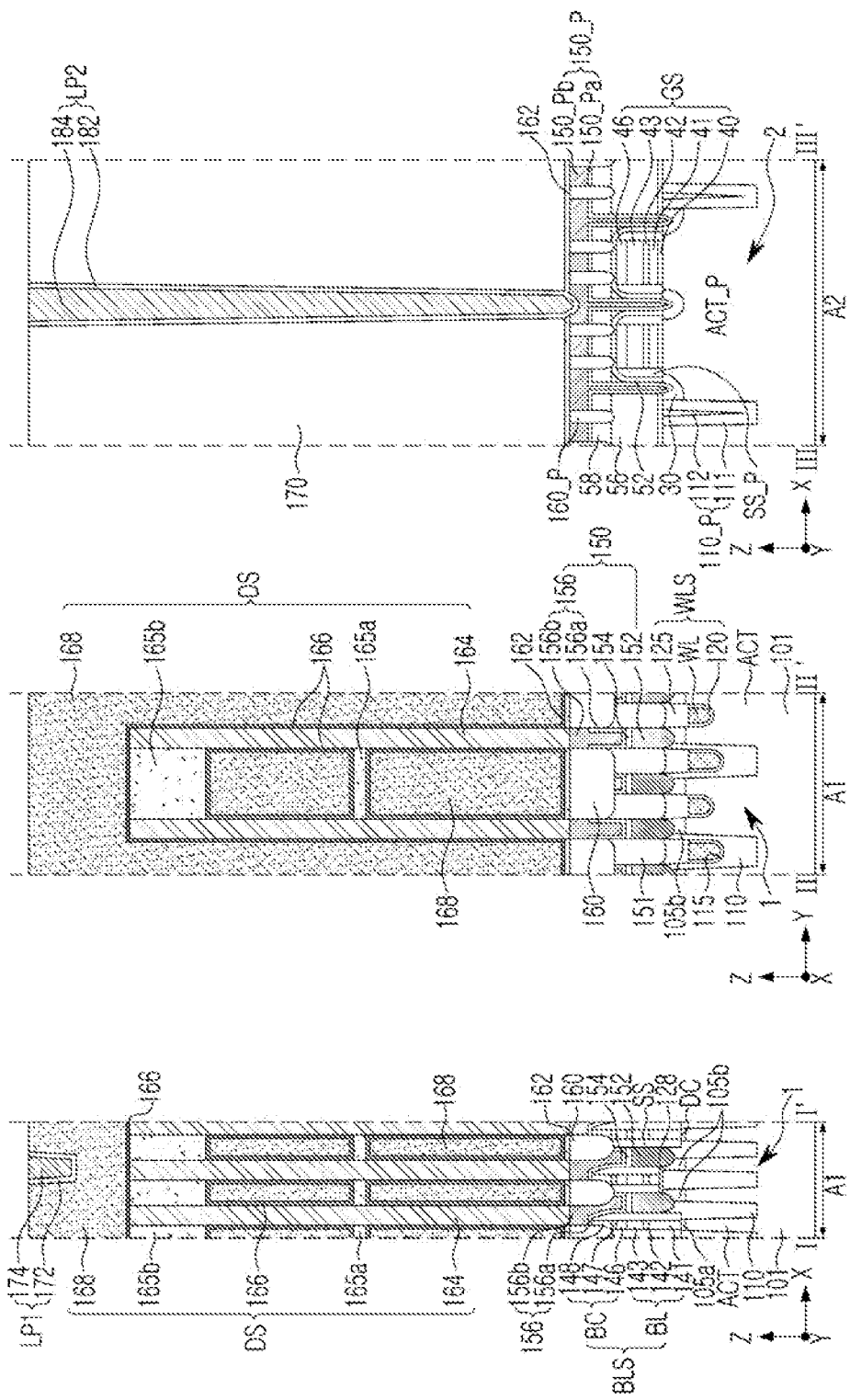

Referring to FIG. 8, the first filling material layer FM1 and the first barrier material layer BM1 may be partially removed by performing a planarization process. Accordingly, the lower plug LP1 including the lower barrier layer 172 and the lower conductive layer 174 may be formed in the lower contact hole LH1, and the peripheral lower plug LP2 including the peripheral lower barrier layer 182 and the peripheral lower conductive layer 184 may be formed in the peripheral lower contact hole LH2.

Figure 9:
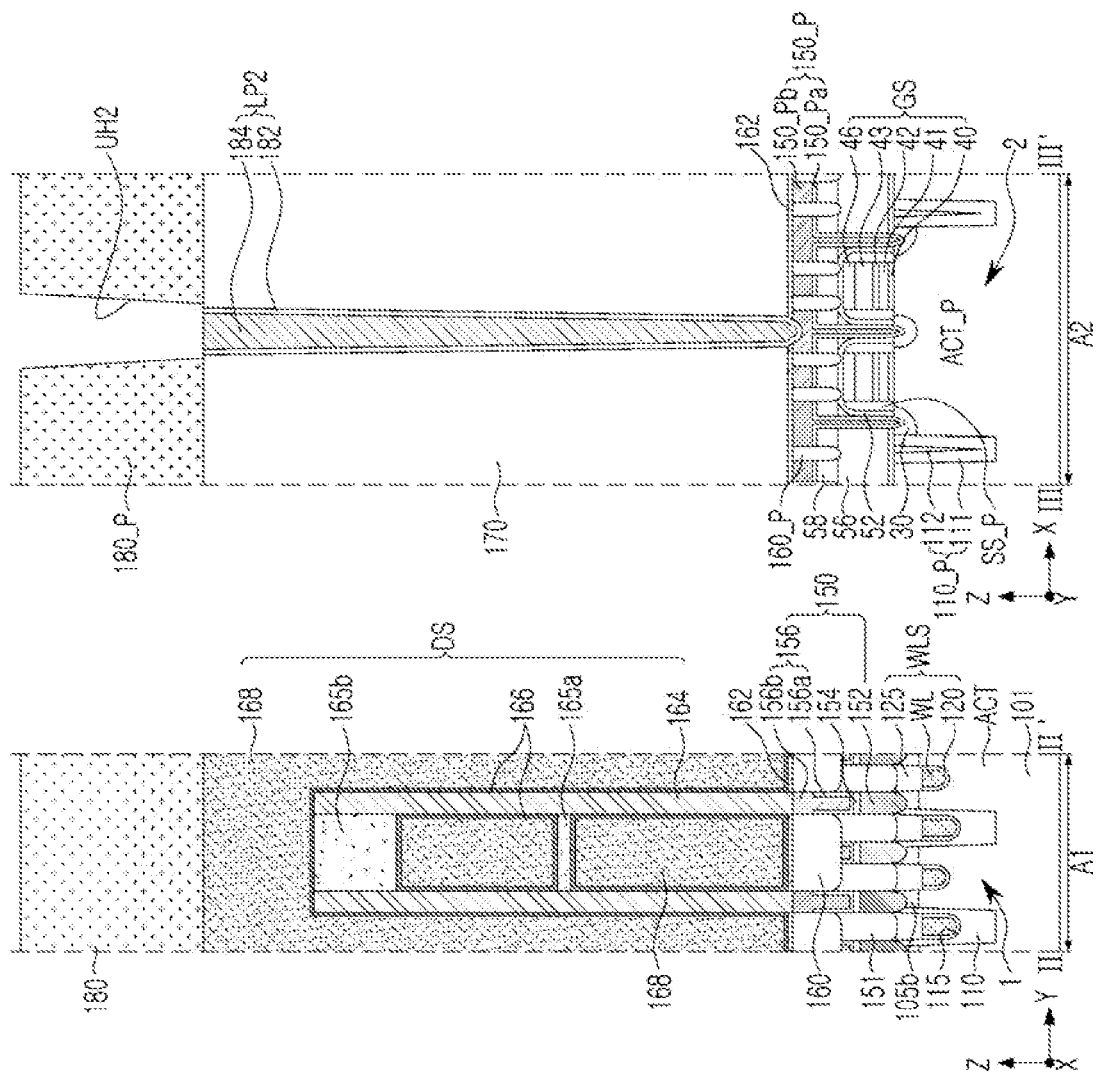

Referring to FIG. 9, an upper contact hole UH1 and a peripheral upper contact hole UH2 may be formed by forming the first upper insulating layer 180 and the first peripheral upper insulating layer 180_P, forming a second mask layer on the first upper insulating layer 180 and the first peripheral upper insulating layer 180_P, and performing a photo process and an etching process. The upper contact hole UH1 may pass through the first upper insulating layer 180 to expose an upper surface of the lower plug LP1. The peripheral upper contact hole UH2 may pass through the first peripheral upper insulating layer 180_P to expose an upper surface of the peripheral lower plug LP2.

Figure 10:
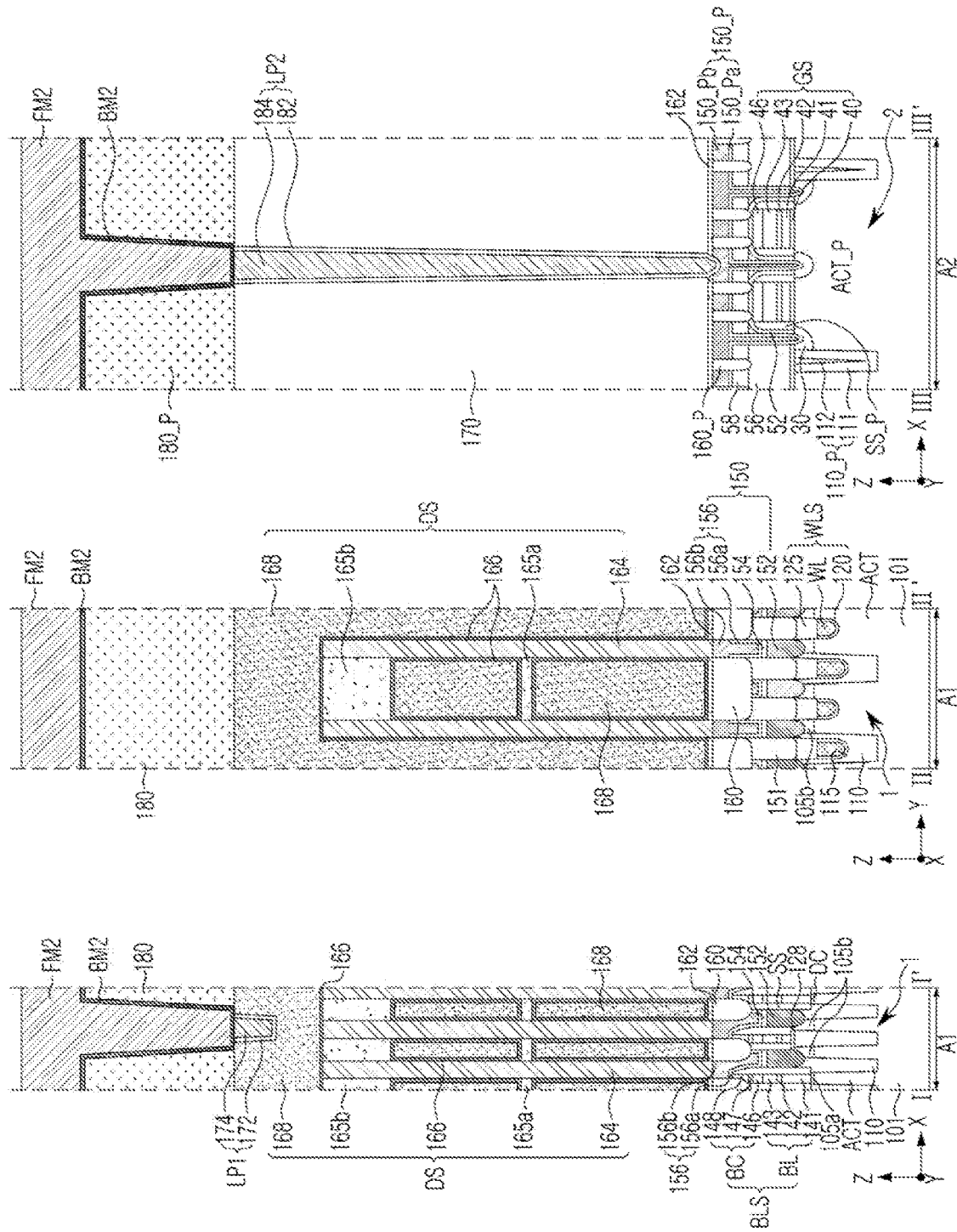

Referring to FIG. 10, a second barrier material layer BM2 and a second filling material layer FM2 may be sequentially formed on the upper contact hole UH1 and the peripheral upper contact hole UH2.

The second barrier material layer BM2 may cover the inner surface and the lower surface of the upper contact hole UH1 and the upper surface of the first upper insulating layer 180 with a uniform thickness. The second barrier material layer BM2 may cover the inner surface and the lower surface of the peripheral upper contact hole UH2 and the upper surface of the first peripheral upper insulating layer 180_P with a uniform thickness. The second filling material layer FM2 may cover the second barrier material layer BM2, and may fill the upper contact hole UH1 and the peripheral upper contact hole UH2.

Figure 11:
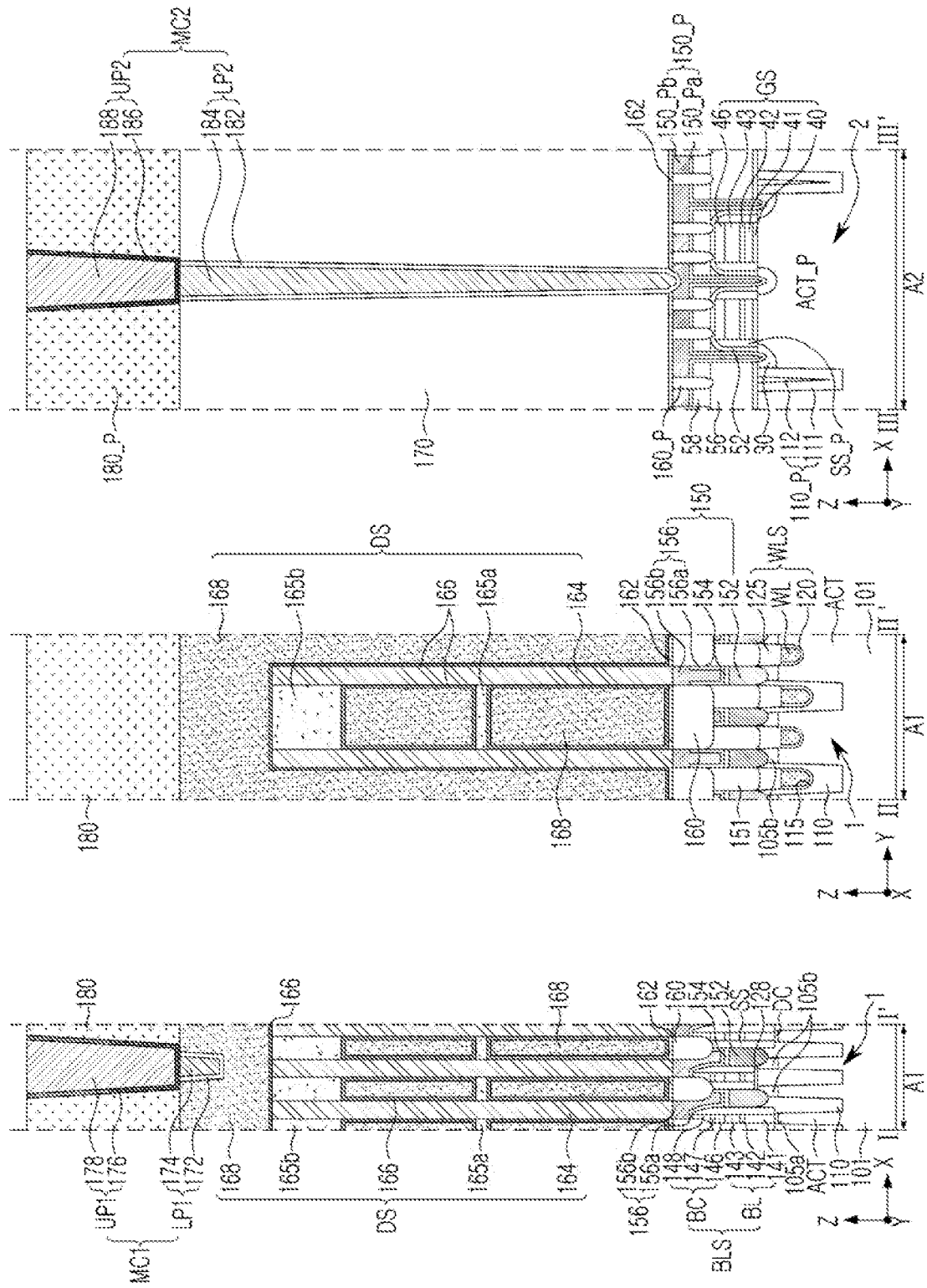

Referring to FIG. 11, the second filling material layer FM2 and the second barrier material layer BM2 may be partially removed by performing a planarization process. Accordingly, the upper plug UP1 including the upper barrier layer 176 and the upper conductive layer 178 may be formed in the upper contact hole UH1, and the peripheral lower plug LP2 including the peripheral upper barrier layer 186 and the peripheral upper conductive layer 188 may be formed in the peripheral upper contact hole UH2. The contact structure MC1 may be formed to have a double pillar structure including the lower plug LP1 and the upper plug UP1, and the peripheral contact structure MC2 may be formed to have a double pillar structure including the peripheral lower plug LP2 and the peripheral upper plug UP2.

A contact structure having a double pillar structure may help reduce a bending defect of the contact structure and help control a size of the contact structure, as compared to a contact structure having a one-stack pillar structure, such that a separation distance from another upper wiring and/or another upper wiring may be secured, thereby increasing a reliability margin. In addition, a limitation of a photo process due to continuous scaling down may be overcome without introducing a multi-patterning process such as a double patterning technique or an extreme ultraviolet (EUV) process. Accordingly, the generation of a current photo process may be extended, thereby reducing manufacturing costs of a semiconductor device.

Thereafter, the semiconductor device 100 of FIGS. 2 to 3B may be manufactured by forming the second upper insulating layer 190, the second peripheral upper insulating layer 190_P, and first wiring layers M1.

Figure 12:
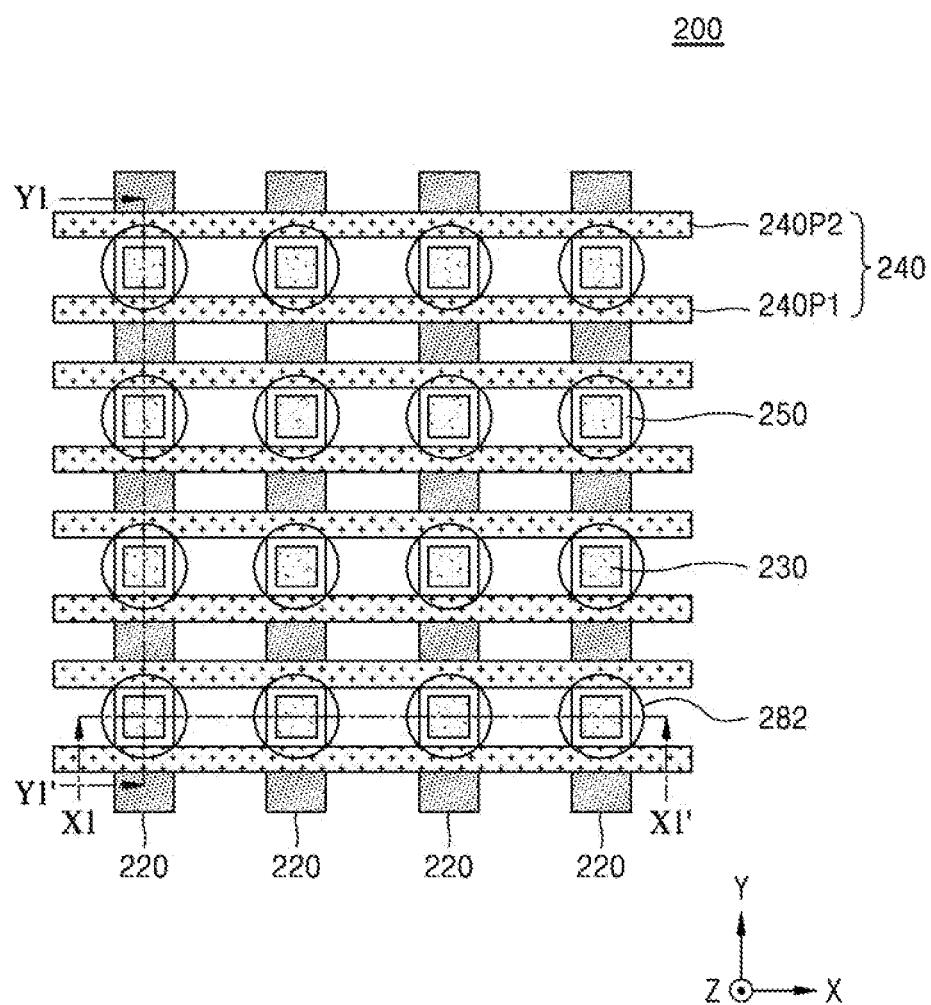
FIG. 12 is a layout diagram illustrating an integrated circuit device according to example embodiments.

FIG. 12 is a layout diagram illustrating an integrated circuit device according to example embodiments.

Figure 13:
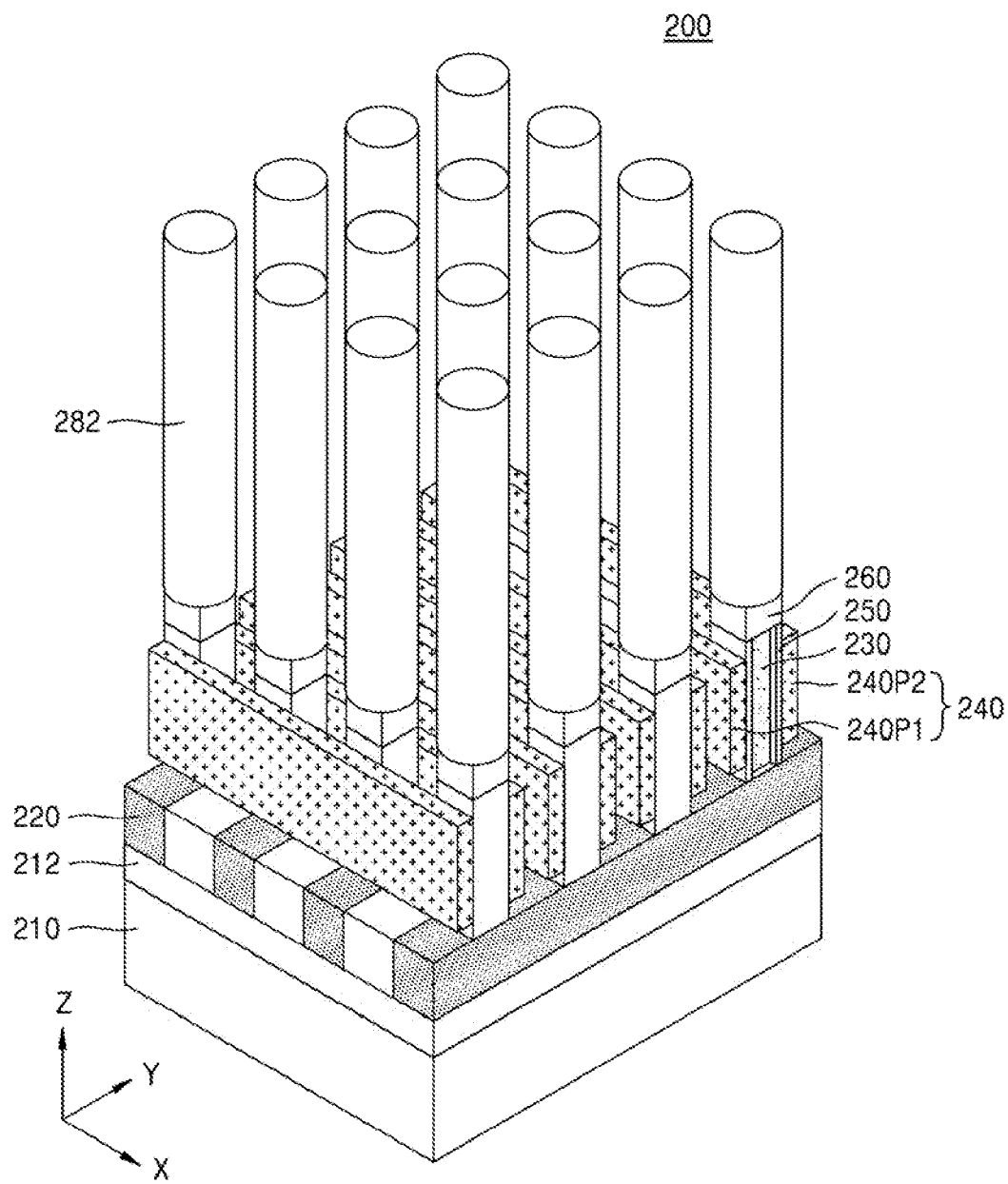
FIG. 13 is a perspective view illustrating an integrated circuit device according to example embodiments.

FIG. 13 is a perspective view illustrating an integrated circuit device according to example embodiments.

Figure 14:
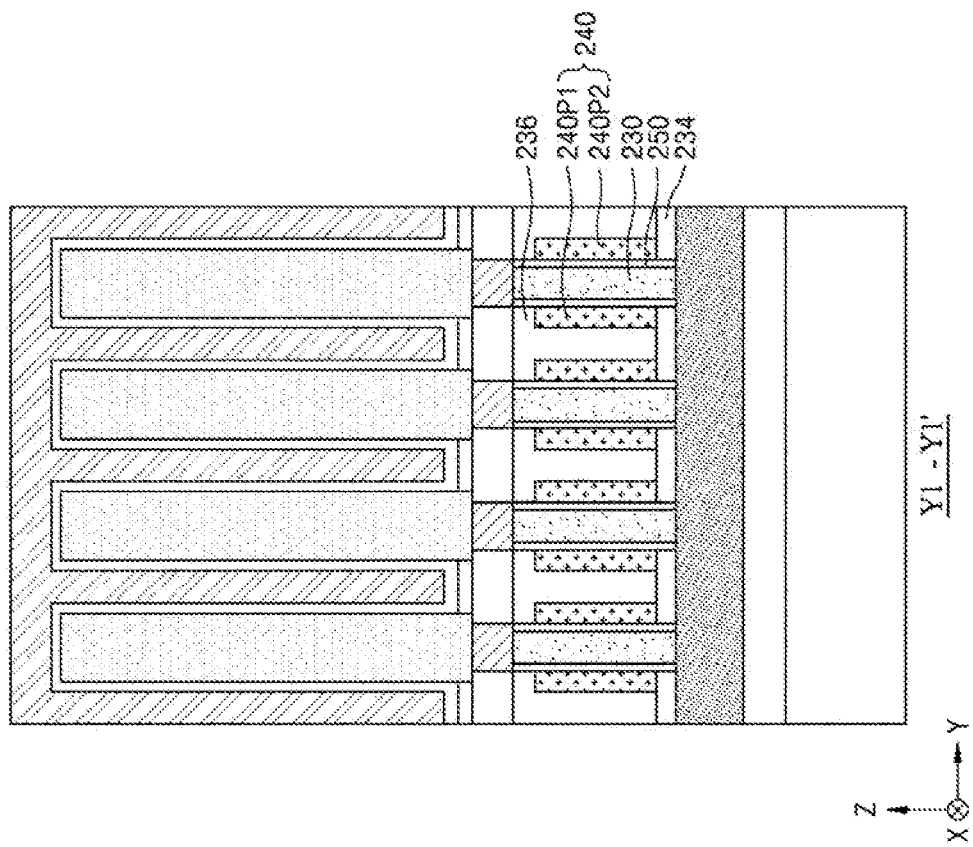
FIG. 14 is a cross-sectional view of an integrated circuit device according to example embodiments.
Figure 14:
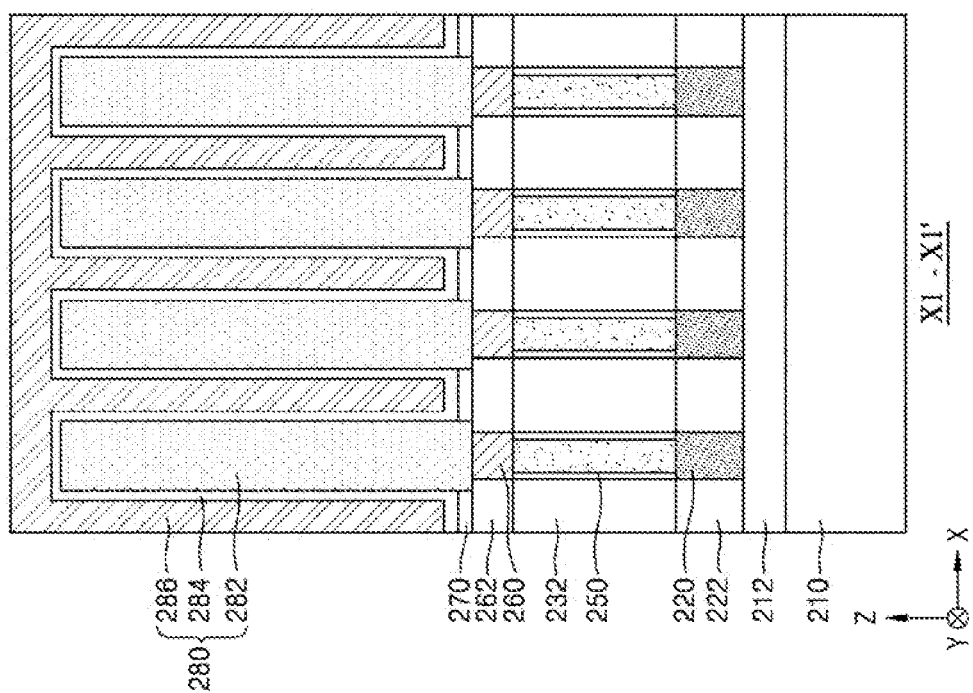

FIG. 14 is a cross-sectional view of an integrated circuit device according to example embodiments. FIG. 14 is a cross-sectional view taken along lines X1-X1' and Y1-Y1' of FIG. 12.

Referring to FIGS. 12 to 14, an integrated circuit device 200 may include a substrate 210, a plurality of first conductive lines 220, a channel layer 230, a gate electrode 240, a gate insulating layer 250, and an information storage structure 280. The integrated circuit device 200 may be a memory device including a vertical channel transistor VCT. The vertical channel transistor may refer to a structure in which a channel length of the channel layer 230 extends from the substrate 210 in a vertical direction.

A lower insulating layer 212 may be disposed on the substrate 210, and a plurality of first conductive lines 220 may be spaced apart from each other on the lower insulating layer 212 in a first direction (X-direction) and may extend in a second direction (Y-direction). A plurality of first insulating patterns 222 may be disposed on the lower insulating layer 212 to fill a space between the plurality of first conductive lines 220. The plurality of first insulating patterns 222 may extend in the second direction (Y-direction), and upper surfaces of the plurality of first insulating patterns 222 may be on a level the same as that of upper surfaces of the plurality of first conductive lines 220. The plurality of first conductive lines 220 may function as bit lines of the integrated circuit device 200.

In an implementation, the plurality of first conductive lines 220 may include doped polysilicon, a metal, a conductive metal nitride, a conductive metal silicide, a conductive metal oxide, or combinations thereof. In an implementation, the plurality of first conductive lines 220 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or combinations thereof. The plurality of first conductive lines 220 may include a single layer or multiple layers of the above-described materials. In an implementation, the plurality of first conductive lines 220 may include a two-dimensional semiconductor material. In an implementation, the two-dimensional semiconductor material may include graphene, carbon nanotubes, or a combination thereof.

The channel layer 230 may be arranged on the plurality of first conductive lines 220 in a matrix form of being spaced apart from each other in the first direction (X-direction) and the second direction (Y-direction). The channel layer 230 may have a first width in the first direction (X-direction) and a first height in a third direction (Z-direction), and the first height may be greater than the first width. In an implementation, the first height may be about 2 to 10 times the first width. A bottom portion of the channel layer 230 may function as a first source/drain region, an upper portion of the channel layer 230 may function as a second source/drain region, and a portion of the channel layer 230 between the first and second source/drain regions may function as a channel region.

In an implementation, the channel layer 230 may include an oxide semiconductor. In an implementation, the oxide semiconductor may include In$_x$Ga$_y$Zn$_z$O, In$_x$Ga$_y$Si$_z$O, In$_x$Sn$_y$Zn$_z$O, In$_x$Zn$_y$O, Zn$_x$O, Zn$_x$Sn$_y$O, Zn$_x$O$_y$N, Zr$_x$Zn$_y$Sn$_z$O, Sn$_x$O, Hf$_x$In$_y$Zn$_z$O, Ga$_x$Zn$_y$Sn$_z$O, Al$_x$Zn$_y$Sn$_z$O, Yb$_x$Ga$_y$Zn$_z$O, In$_x$Ga$_y$O, or combinations thereof. The channel layer 230 may include a single layer or multiple layers of the oxide semiconductor. In an implementation, the channel layer 230 may have a bandgap energy greater than that of silicon. In an implementation, the channel layer 230 may have a bandgap energy of about 1.5 eV to about 5.6 eV. In an implementation, the channel layer 230 may have optimal channel performance when the channel layer 230 has a bandgap energy of about 2.0 eV to 4.0 eV. In an implementation, the channel layer 230 may be polycrystalline or amorphous. In an implementation, the channel layer 230 may include a two-dimensional semiconductor material. In an implementation, the two-dimensional semiconductor material may include graphene, carbon nanotubes, or a combination thereof.

The gate electrode 240 may extend on opposite sidewalls of the channel layer 230 in the first direction (X-direction). The gate electrode 240 may include a first sub-gate electrode 240P1 opposing a first sidewall of the channel layer 230 and a second sub-gate electrode 240P2 opposing a second sidewall opposite to the first sidewall of the channel layer 230. In an implementation, one channel layer 230 may be between the first sub-gate electrode 240P1 and the second sub-gate electrode 240P2, and the integrated circuit device 200 may have a dual-gate transistor structure. In an implementation, the second sub-gate electrode 240P2 may be omitted and only the first sub-gate electrode 240P1 opposing the first sidewall of the channel layer 230 may be formed to implement a single gate transistor structure.

The gate electrode 240 may include doped polysilicon, a metal, a conductive metal nitride, a conductive metal silicide, a conductive metal oxide, or combinations thereof. In an implementation, the gate electrode 240 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$ or combinations thereof.

The gate insulating layer 250 may surround a sidewall of the channel layer 230 and may be between the channel layer 230 and the gate electrode 240. In an implementation, as illustrated in FIG. 14, the entire sidewall of the channel layer 230 may be surrounded by the gate insulating layer 250, and a portion of a sidewall of the gate electrode 240 may be in (e.g., direct) contact with the gate insulating layer 250. In an implementation, the gate insulating layer 250 may extend in a direction of extension of the gate electrode 240 (e.g., the first direction (X-direction)), and only two sidewalls opposing the gate electrode 240 among sidewalls of the channel layer 230 may be in contact with the gate insulating layer 250.

In an implementation, the gate insulating layer 250 may be formed of a silicon oxide film, a silicon oxynitride film, a high-κ film having a higher dielectric constant than that of the silicon oxide film, or combinations thereof. The high-κ film may be formed of a metal oxide or a metal oxynitride. In an implementation, the high-κ film usable as the gate insulating layer 250 may be formed of $HfO_2$, HfSiO, HfSiON, HfTaO, HfTiO, HfZrO, $ZrO_2$, $Al_2O_3$, or combinations thereof.

A plurality of second insulating patterns 232 may extend on the plurality of first insulating patterns 222 in the second direction (Y-direction), and the channel layer 230 may be between two adjacent second insulating patterns 232 among the plurality of second insulating patterns 232. In addition, between the two adjacent second insulating patterns 232, a first buried layer 234 and a second buried layer 236 may be in a space between two adjacent channel layers 230. The first buried layer 234 may be on a bottom portion of the space between the two adjacent channel layers 230, and the second buried layer 236 may be on the first buried layer 234 to fill a remainder of the space between the two adjacent channel layers 230. An upper surface of the second buried layer 236 may be on a level the same as that of an upper surface of the channel layer 230, and the second buried layer 236 may cover an upper surface of the gate electrode 240. In an implementation, the plurality of second insulating patterns 232 may be formed as a material layer continuous with the plurality of first insulating patterns 222, or the second buried layer 236 may be formed as a material layer continuous with the first buried layer 234.

A storage contact 260 may be on the channel layer 230. The storage contact 260 may vertically overlap the channel layer 230, and may be arranged in a matrix form of being spaced apart from each other in the first direction (X-direction) and the second direction (Y-direction). In an implementation, the storage contact 260 may include, e.g., Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or combinations thereof. The upper insulating layer 262 may surround a sidewall of the storage contact 260 on the plurality of second insulating patterns 232 and the second buried layer 236.

An etch-stop film 270 may be on the upper insulating layer 262, and the information storage structure 280 may be on the etch-stop film 270. The information storage structure 280 may include a lower electrode 282, a dielectric layer 284, and an upper electrode 286.

The lower electrode 282 may pass through the etch-stop film 270 to be electrically connected to an upper surface of the storage contact 260. The lower electrode 282 may be formed as a pillar-type electrode extending in the third direction (Z-direction). In an implementation, the lower electrode 282 may vertically overlap the storage contact 260, and may be arranged in a matrix form of being spaced apart from each other in the first direction (X-direction) and the second direction (Y-direction). In an implementation, a landing pad may be further disposed between the storage contact 260 and the lower electrode 282, such that the lower electrode 282 may be arranged to have a hexagonal shape.

The vertical channel transistor VCT of FIGS. 12 to 14 may be in the first region A1 of the substrate 101 of FIG. 1A and may be referred to as a "first structure." The integrated circuit device 200 of FIGS. 12 to 14 may further include a structure corresponding to the second structure 2 illustrated in FIGS. 1A to 2.

The integrated circuit device 200 may further include a contact structure (see "MC1" in FIG. 2) on the information storage structure 280. The integrated circuit device 200 may further include the second structure 2 and a peripheral contact structure (see "MC2" in FIG. 2) on the structure corresponding to the second structure 2.

Figure 15:
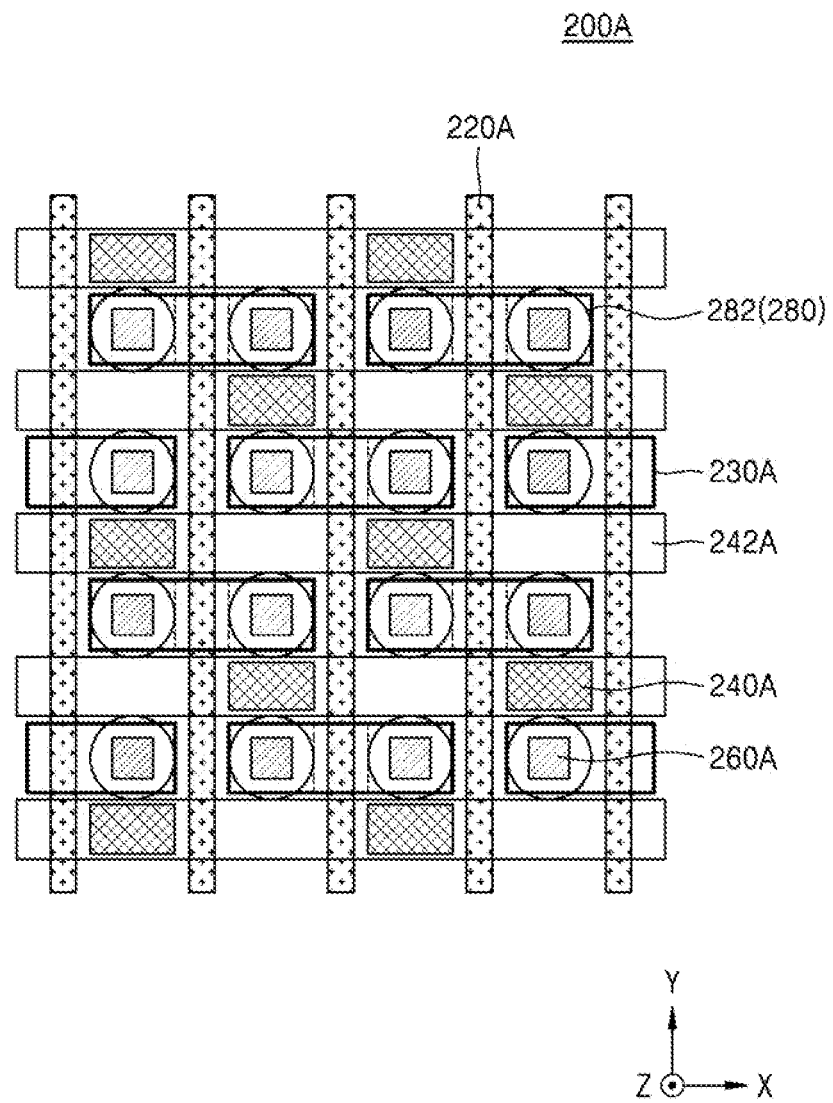
FIG. 15 is a layout diagram illustrating an integrated circuit device according to example embodiments.

FIG. 15 is a layout diagram illustrating an integrated circuit device according to example embodiments.

Figure 16:
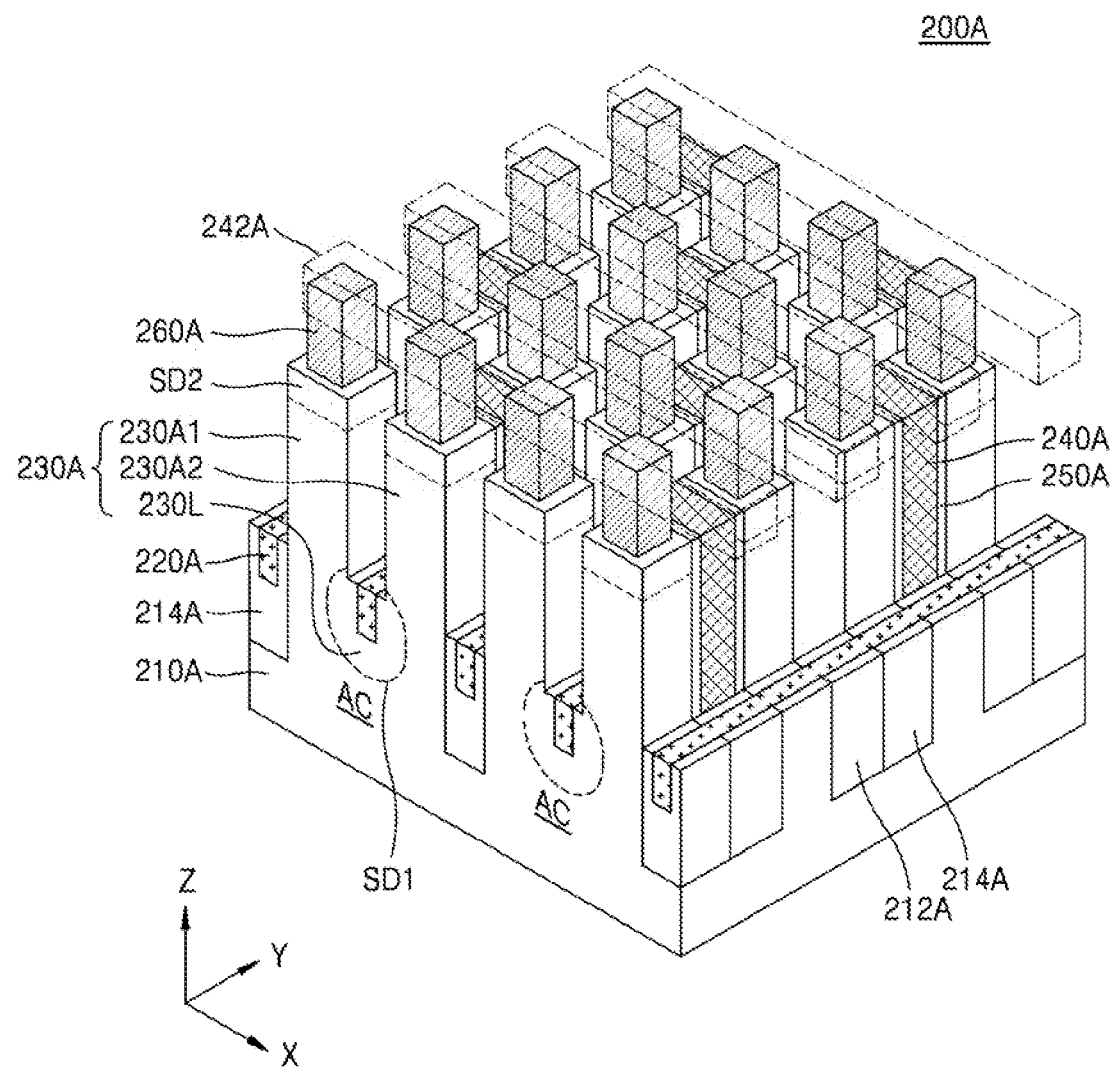
FIG. 16 is a perspective view illustrating an integrated circuit device according to example embodiments.

FIG. 16 is a perspective view illustrating an integrated circuit device according to example embodiments.

Referring to FIGS. 15 and 16, an integrated circuit device 200A may include a substrate 210A, a plurality of first conductive lines 220A, a channel structure 230A, a contact gate electrode 240A, a plurality of second conductive lines. 242A, and an information storage structure 280. The integrated circuit device 200A may be a memory device including the vertical channel transistor VCT.

A plurality of active regions AC may be defined in the substrate 210A by a first isolation layer 212A and a second isolation layer 214A. The channel structure 230A may be in each active region AC, and the channel structure 230A may include a first active pillar 230A1 and a second active pillar 230A2 respectively extending in a vertical direction, and a connection portion 230L connected to a bottom portion of a first active pillar 230A1 and a bottom portion of a second active pillar 230A2. A first source/drain area SD1 may be in the connection portion 230L, and a second source/drain area SD2 may be on upper sides of the first and second active pillars 230A1 and 230A2. The first active pillar 230A1 and the second active pillar 230A2 may be included in an independent unit memory cell, respectively.

The plurality of first conductive lines 220A may extend in a direction, intersecting each of the plurality of active regions AC, e.g., in the second direction (Y-direction). One first conductive line 220A among the plurality of first conductive lines 220A may be on the connection portion 230L between the first active pillar 230A1 and the second active pillar 230A2, and the one first conductive line 220A may be on a first source/drain region SD1. The other first conductive line 220A adjacent to the one first conductive line 220A may be between two channel structures 230A. One first conductive line 220A among the plurality of first conductive lines 220A may function as a common bit line included in two unit memory cells including the first active pillar 230A1 and the second active pillar 230A2 disposed on opposite sides of the one first conductive line 220A.

One contact gate electrode 240A may be between two channel structures 230A adjacent in the second direction (Y-direction). In an implementation, the contact gate electrode 240A may be between the first active pillar 230A1 included in one channel structure 230A and the second active pillar 230A2 of the channel structure 230A adjacent thereto, and the one contact gate electrode 240A may be shared by the first active pillar 230A1 and the second active pillar 230A2 on opposite sidewalls thereof. A gate insulating layer 250A may be between the contact gate electrode 240A and the first active pillar 230A1 and between the contact gate electrode 240A and the second active pillar 230A2. A plurality of second conductive lines 242A may extend in the first direction (X-direction) on an upper surface of the contact gate electrode 240A. The plurality of second conductive lines 242A may function as word lines of the integrated circuit device 200A.

A storage contact 260A may be on the channel structure 230A. The storage contact 260A may be on a second source/drain region SD2, and the information storage structure 280 may be on the storage contact 260A.

The vertical channel transistor VCT of FIGS. 15 and 16 may be in the first region A1 of the substrate 101 of FIG. 1A, and may be referred to as a "first structure." The integrated circuit device 200A of FIGS. 15 to 16 may further include a structure corresponding to the second structure 2 illustrated in FIGS. 1A to 2.

The integrated circuit device 200A may further include a contact structure (see "MC1" in FIG. 2) on the information storage structure 280. The integrated circuit device 200A may further include the second structure 2 and a peripheral contact structure (see "MC2" in FIG. 2) on the structure corresponding to the second structure 2.

Figure 17:
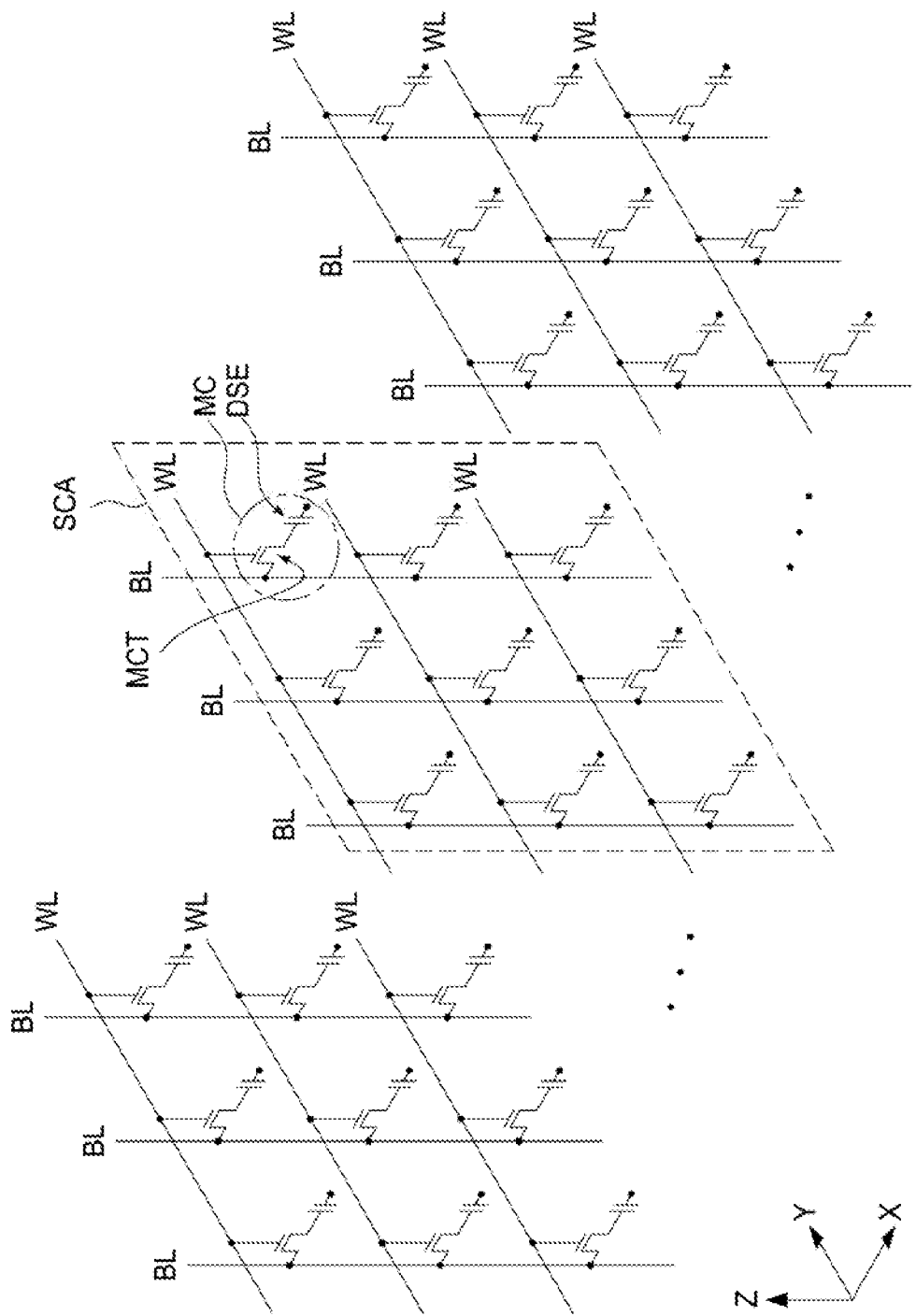
FIG. 17 is a simplified circuit diagram illustrating a cell array of a semiconductor device according to example embodiments.

FIG. 17 is a simplified circuit diagram illustrating a cell array of a semiconductor device according to example embodiments.

Referring to FIG. 17, a cell array of a semiconductor device according to example embodiments may include a plurality of sub-cell arrays SCA. The plurality of sub-cell arrays SCA may be arranged in an X-direction. Each of the plurality of sub-cell arrays SCA may include a plurality of bit lines BL, a plurality of word lines WL, and a plurality of memory cells MC. The memory cell MC may include a memory cell transistor MCT and an information storage element DSE. One memory cell MC may be disposed between one word line WL and one bit line BL. The cell array of the semiconductor device may correspond to a memory cell array of a DRAM device.

The word lines WL may extend in a Y-direction. The word lines WL in one sub-cell array SCA may be spaced apart from each other in a Z-direction. The bit lines BL may extend in the Z-direction. The bit lines BL in one sub cell array SCA may be spaced apart from each other in the Y-direction. The word lines WL and the bit lines BL may be conductive patterns (e.g., metal lines) on a substrate (301 in FIG. 18) and extending in a direction.

The memory cell transistor MCT may include a gate, a source, and a drain. The gate may be connected to the word line WL, the source may be connected to the bit line BL, and the drain may be connected to the information storage element DSE. The information storage element DSE may include a capacitor including lower and upper electrodes and a dielectric layer.

Figure 18:
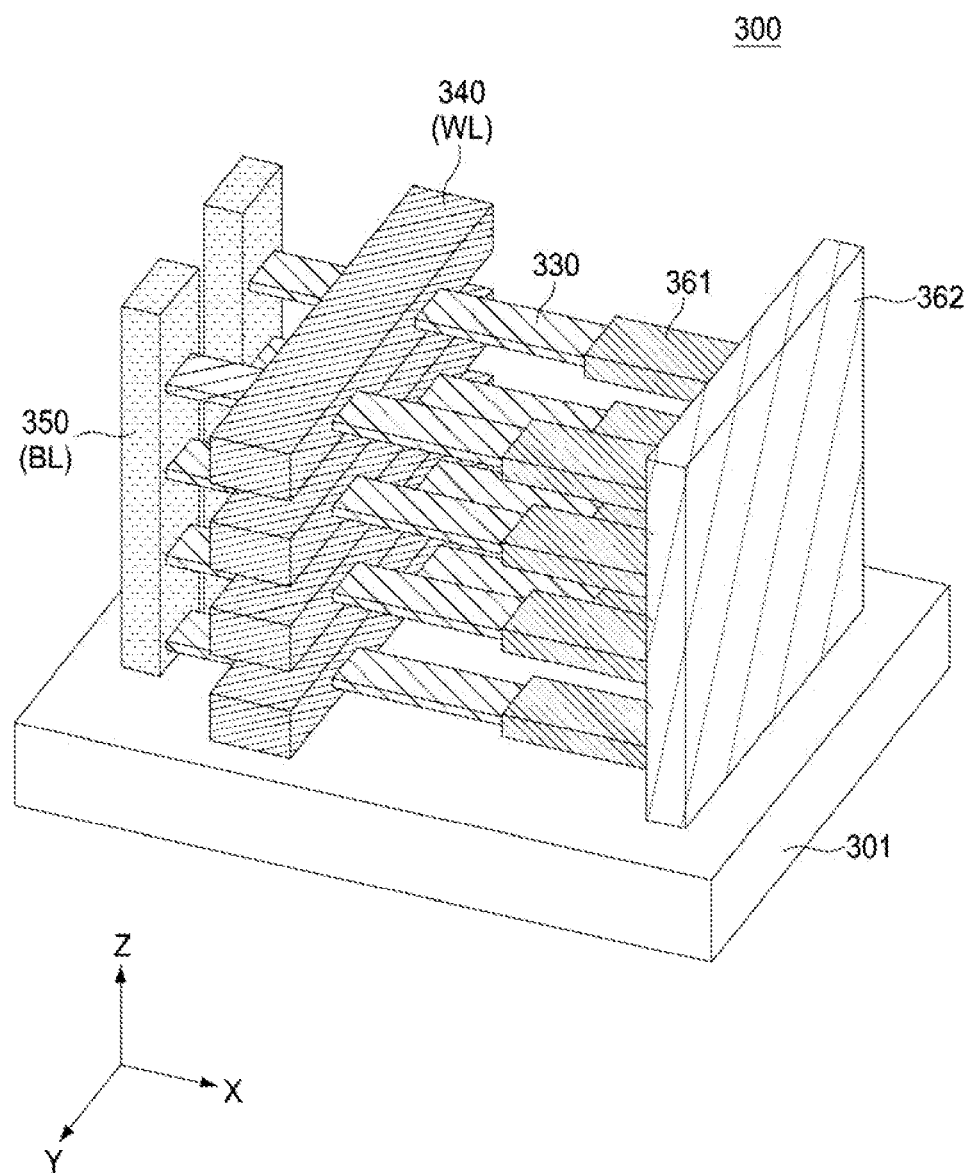
FIG. 18 is a perspective view illustrating a semiconductor device according to example embodiments.

FIG. 18 is a perspective view illustrating a semiconductor device according to example embodiments.

Figure 19:
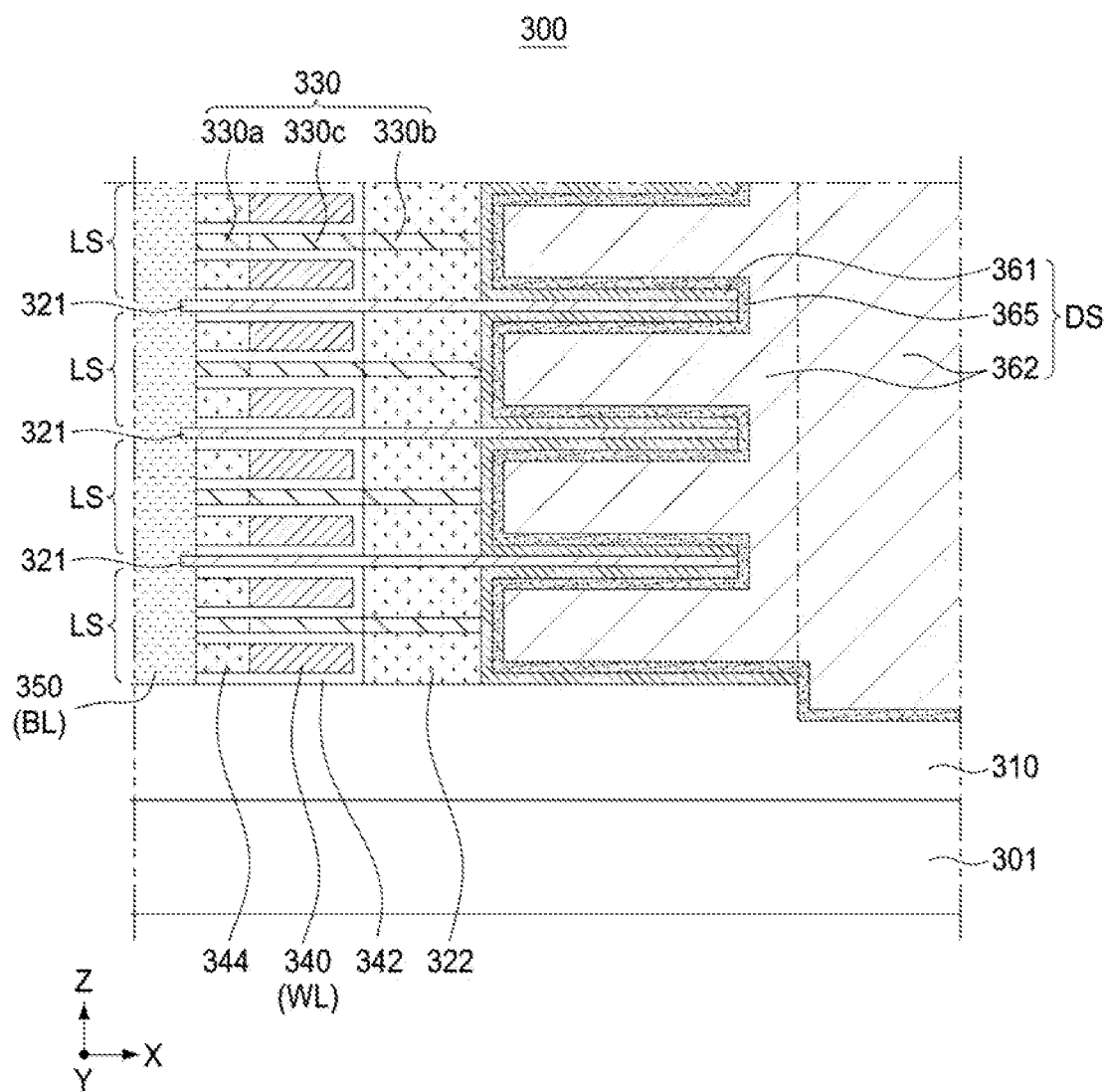
FIG. 19 is a cross-sectional view of a semiconductor device according to example embodiments.

FIG. 19 is a cross-sectional view of a semiconductor device according to example embodiments. FIG. 19 illustrates a cross-section corresponding to the semiconductor device of FIG. 18. FIG. 19 illustrates a structure of a pair of adjacent sub-cell arrays described with reference to FIG. 18.

Referring to FIGS. 18 and 19, a semiconductor device 300 may include a substrate 301, a lower structure 310 on the substrate 301, a plurality of structures LS alternately stacked on the substrate 301, a plurality of first insulating layers 321, and a plurality of second conductive patterns 350 spaced apart from each other. Each of the plurality of structures LS may include an active layer 330 extending in an X-direction, a first conductive pattern 340 intersecting the active layer 330 and extending in a Y-direction, perpendicular to the X-direction, a gate dielectric layer 342 between the active layer 330 and the first conductive pattern 340, a gate capping layer 344 between the first conductive pattern 340 and the second conductive pattern 350, a first electrode 361 of the information storage structure DS, and a second insulating layer 322 between the first conductive pattern 340 and the first electrode 361. The information storage structure DS may further include a dielectric layer 365 on the first electrode 361 and a second electrode 362 on the dielectric layer 365. The X-direction and the Y-direction may be perpendicular to each other, and may be parallel to an upper surface of the substrate 301. The Z-direction may be perpendicular to the X-direction and the Y-direction, and may be perpendicular to the upper surface of the substrate 301.

The lower structure 310 may be disposed on the substrate 301. The plurality of structures LS and the plurality of first insulating layers 321 may be stacked on the lower structure 310. The lower structure 310 may include a device region on the substrate 301 and an insulating region covering the device region. The insulating region may be formed of an insulating material, e.g., insulating layers including silicon oxide, silicon nitride, silicon oxynitride, or silicon oxycarbide.

The plurality of structures LS and the plurality of first insulating layers 321 may form a stacked structure on the substrate 301. The plurality of structures LS may be between the plurality of first insulating layers 321, and may be spaced apart from each other in the Z-direction by the plurality of first insulating layers 321. The first insulating layer 321 may extend in the X-direction, and an end portion thereof may extend into the second conductive pattern 350. The second insulating layer 322 may be between the first insulating layer 321 and the active layer 330 and between the first conductive pattern 340 and the information storage structure DS. The first insulating layer 321 and the second insulating layer 322 may respectively include an insulating material, e.g., at least one of silicon oxide, silicon nitride, silicon oxynitride, or silicon oxycarbide. The first insulating layer 321 may horizontally extend to be longer than the second insulating layer 322. A thickness of the second insulating layer 322 may be greater than a thickness of the first insulating layer 321.

The active layer 330 may be on the substrate 301, and may horizontally extend in the X-direction. A plurality of active layers 330 may be stacked spaced apart from each other in the Z-direction, and may be arranged in the Y-direction. The plurality of active layers 330 arranged in the Z-direction may be disposed between the plurality of first insulating layers 321. The active layer 330 may have a line shape, a bar shape, or a column shape intersecting the first conductive pattern 340 and extending in the X-direction. The active layer 330 may include a semiconductor material, e.g., silicon, germanium, or silicon-germanium.

The active layer 330 may include a first impurity region 330a, a second impurity region 330b, and a channel region 330c. The first impurity region 330a may be electrically connected to the second conductive pattern 350. The second impurity region 330b may be electrically connected to the first electrode 361 of the information storage structure DS. A length of the second impurity region 330b in the X-direction may be longer than a length of the first impurity region 330a in the X-direction. The channel region 330c may be between the first impurity region 330a and the second impurity region 330b. The channel region 330c may overlap the first conductive pattern 340.

The first impurity region 330a and the second impurity region 330b may be formed by performing a process of doping or ion implantation of impurities on the active layer 330. The first impurity region 330a and the second impurity region 330b may have an N-type or P-type conductivity.

A portion of the first impurity region 330a may correspond to a source region of the memory cell transistor MCT of FIG. 1, a portion of the second impurity region 330b may correspond to a drain region of the memory cell transistor MCT of FIG. 1, and the channel region 330c may correspond to a channel of the memory cell transistor MCT of FIG. 1. A portion of the first impurity region 330a may provide a first contact region for directly connecting the source region of the memory cell transistor MCT to the second conductive pattern 350, that is, the bit line BL, and a portion of the second impurity region 330b may provide a second contact region for directly connecting the drain region of the memory cell transistor MCT to the information storage element DSE, e.g., the information storage structure DS.

In an implementation, active layers 130 may be formed of an oxide semiconductor, e.g., hafnium-silicon oxide (HSO), hafnium-zinc oxide (HZO), indium-zinc oxide (IZO), indium-gallium oxide (IGO), indium-tin oxide (ITO), indium-gallium-zinc oxide (IGZO), or indium-tin-zinc oxide (ITZO).

In an implementation, the active layers 130 may include a two-dimensional (2D) material in which atoms form a predetermined crystal structure and form a channel of a transistor. The 2D material layer may include a transition metal dichalcogenide (TMD) material layer, a black phosphorous material layer, or a hexagonal boron-nitride (hBN) material layer. In an implementation, the 2D material layer may include, e.g., BiOSe, Crl, $WSe_2$, $MoS_2$, TaS, WS, SnSe, ReS, $\beta$-SnTe, MnO, AsS, P(black), InSe, h-BN, GaSe, GaN, SrTiO, MXene, or Janus 2D materials capable of forming the 2D material.

In an implementation, the structure LS may further include epitaxial layers grown from the active layer 130 and respectively connected to a first region 130a and a second region 130b of the active layer 130.

The first conductive pattern 340 may be on the substrate 301 and may horizontally extend in the Y-direction. A plurality of first conductive patterns 340 may be stacked spaced apart from each other in the Z-direction, and may be arranged in the X-direction. The first conductive pattern 340 may be between the channel region 330c of the active layer 330 and the first insulating layer 321. The first conductive pattern 340 may be on an upper surface 330US and a lower surface 330LS of the active layer 330. The first conductive pattern 340 may have a line shape, a bar shape, or a pillar shape intersecting the second conductive pattern 350 and extending in the Y-direction. In an implementation, the plurality of first conductive patterns 340 stacked in the Z-direction in one memory cell may extend to have different lengths in the Y-direction so as to provide a contact region in which respective upper surfaces thereof are exposed.

The first conductive pattern 340 may include a conductive material, and the conductive material may include a doped semiconductor material, a conductive metal nitride, a metal, or a metal-semiconductor compound. The first conductive pattern 340 may be the word line WL described with reference to FIG. 17, and may also be referred to as a "gate electrode."

The gate dielectric layer 342 may be between the first conductive pattern 340 and the active layer 330. The gate dielectric layer 342 may have a substantially conformal thickness in an inner space of a gap region formed by etching the second insulating layer 322 from a side surface thereof between adjacent first insulating layers 321. The gate dielectric layer 342 may include silicon oxide, silicon nitride, or a high-κ material.

The gate capping layer 344 may fill a region in which the first conductive pattern 340 is partially removed from a side surface thereof. In an implementation, the side surface of the gate capping layer 344 may be in (e.g., direct) contact with a side surface of the first conductive pattern 340, and upper and lower surfaces of the gate capping layer 344 may be covered by the gate dielectric layer 342. The gate capping layer 344 may electrically insulate the first conductive pattern 340 and the second conductive pattern 350 from each other.

The second conductive pattern 350 may vertically extend on the substrate 301 in the Z-direction. The plurality of second conductive patterns 350 may be arranged in the Y-direction. The second conductive pattern 350 may be adjacent to the first impurity region 330a and a first end surface of the active layer 330. The second conductive pattern 350 may have an inclined inner surface opposing inclined side surfaces of the first epitaxial layer 335a. The plurality of active layers 330 stacked in the Z-direction may be electrically connected to one second conductive pattern 350. The second conductive pattern 350 may have a line shape, a bar shape, or a pillar shape extending in the Z-direction. In an implementation, the semiconductor device may further include an upper wiring on the second conductive pattern 350, connected to the second conductive pattern 350, and extending in the X-direction. The second conductive pattern 350 may include a doped semiconductor material, a conductive metal nitride, a metal, or a metal-semiconductor compound. The second conductive pattern 350 may be the bit line BL described with reference to FIG. 17.

The information storage structure DS may be adjacent to the second impurity region 330b and a second end surface of the active layer 330. The information storage structure DS may be electrically connected to the active layer 330. The information storage structure DS may include a first electrode 361, a dielectric layer 365 on the first electrode 361, and a second electrode 362 on the dielectric layer 365. In an implementation, the first electrode 361 of the information storage structure DS may have a cylinder shape as illustrated in FIG. 19, or may have a pillar shape in example embodiments.

The first electrode 361 may have a substantially conformal thickness in the inner space of the gap region formed by etching the second insulating layer 322 from the side surface thereof. The first electrode 361 may be in a state in which a node is isolated for each structure LS by depositing a conductive material, and then removing a portion of the conductive material on a side surface of the first insulating layer 321. The first electrode 361 may include a doped semiconductor material, a conductive metal nitride, a metal, or a conductive metal oxide.

The dielectric layer 365 may conformally cover the first electrode 361. The dielectric layer 365 may cover a protruding portion 361p of the first electrode 361, and may include a protruding portion 365p toward the second electrode 362. The dielectric layer 365 may include a high dielectric material or silicon oxide, silicon nitride, silicon oxynitride, or combinations thereof. In an implementation, the dielectric layer 365 may include an oxide, nitride, silicide, oxynitride, or silicified oxynitride including Hf, Al, Zr, or La.

The second electrode 362 may cover the dielectric layer 365. The second electrode 362 may fill an inner space of the first electrode 361 having a cylindrical shape. The second electrode 362 may include a doped semiconductor material, a conductive metal nitride, a metal, or a metal-semiconductor compound.

The cell array of the semiconductor device of FIGS. 17 to 19 may be in the first region A1 of the substrate 101 of FIG. 1A, and the semiconductor device of FIGS. 17 to 19 may further include a structure corresponding to the second structure 2 illustrated in FIGS. 1A to 2.

The semiconductor device 300 may further include a contact structure (see "MC1" in FIG. 2) on the information storage structure DS. The semiconductor device 300 may further include a peripheral contact structure (see "MC2" in FIG. 2) disposed on the structure corresponding to the second structure 2.

By way of summation and review, in order to manufacture a highly scaled semiconductor device, contact technologies may stably connect adjacent conductive structures to each other by minimizing electrical faults between the adjacent conductive structures.

One or more embodiments may provide a semiconductor device having reduced manufacturing costs and improved electrical properties and reliability.

Each of a contact structure and a peripheral contact structure may have a double pillar structure in which a lower plug and an upper plug are stacked in two stacks, thereby reducing manufacturing costs and improving electrical properties and reliability of a semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate;
   lower electrodes on the substrate;
   a dielectric layer on the lower electrodes;
   an upper electrode on the dielectric layer;
   a contact structure connected to the upper electrode; and
   a wiring layer on the contact structure,
   wherein:
   the contact structure includes:
     a lower plug, and
     an upper plug on the lower plug,
   an upper surface of the lower plug is substantially coplanar with an upper surface of the upper electrode,
   a first width of the upper surface of the lower plug is narrower than a second width of a lower surface of the upper plug, and
   the lower surface of the upper plug is in contact with the upper surface of the lower plug.

2. The semiconductor device as claimed in claim 1, wherein the lower plug is buried in the upper electrode.

3. The semiconductor device as claimed in claim 1, wherein
   the lower plug includes a lower barrier layer and a lower conductive layer on the lower barrier layer, and
   the upper plug includes an upper barrier layer and an upper conductive layer on the upper barrier layer.

4. The semiconductor device as claimed in claim 3, wherein the upper barrier layer is in contact with the upper surface of the upper electrode or an upper surface of the lower conductive layer.

5. The semiconductor device as claimed in claim 3, wherein the upper barrier layer includes a material different from a material of the lower barrier layer.

6. The semiconductor device as claimed in claim 3, wherein the upper conductive layer includes a material different from a material of the lower conductive layer.

7. The semiconductor device as claimed in claim 1, wherein
   the upper electrode includes a first electrode layer and a second electrode layer on the first electrode layer, and
   the lower plug is buried in the second electrode layer.

8. The semiconductor device as claimed in claim 1, wherein
   the substrate has a cell region and a peripheral region,
   the semiconductor device further includes:
     a peripheral active region on the peripheral region;
     a circuit conductive contact on the peripheral active region and electrically connected to the peripheral active region; and
     a peripheral contact structure on the circuit conductive contact, and
   the peripheral contact structure includes a peripheral lower plug and a peripheral upper plug on the peripheral lower plug.

9. The semiconductor device as claimed in claim 8, wherein
   a third width of an upper surface of the peripheral lower plug is narrower than a fourth width of a lower surface of the peripheral upper plug, and the lower surface of the peripheral upper plug is in contact with the upper surface of the peripheral lower plug.

10. The semiconductor device as claimed in claim 8, further comprising:
a first peripheral insulating layer on the circuit conductive contact; and
a second peripheral insulating layer on the first peripheral insulating layer,
wherein:
the peripheral lower plug passes through the first peripheral insulating layer, and the peripheral upper plug passes through the second peripheral insulating layer, and
an upper surface of the peripheral lower plug is substantially coplanar with an upper surface of the first peripheral insulating layer.

11. A semiconductor device, comprising:
a cell active region;
a bit line electrically connected to a first region of the cell active region;
an information storage structure electrically connected to a second region of the cell active region, the information storage structure including a lower electrode on the cell active region, a dielectric layer on the lower electrode, and an upper electrode on the dielectric layer; and
a contact structure connected to the upper electrode,
wherein:
the contact structure includes:
a lower plug, and
an upper plug on the lower plug,
the lower plug is buried in the upper electrode,
a first width of an upper surface of the lower plug is narrower than a second width of a lower surface of the upper plug, and
the lower surface of the upper plug is in contact with the upper surface of the lower plug.

12. The semiconductor device as claimed in claim 11, wherein:
the lower plug includes a lower barrier layer and a lower conductive layer on the lower barrier layer, and
the upper plug includes an upper barrier layer and an upper conductive layer on the upper barrier layer.

13. The semiconductor device as claimed in claim 12, wherein an upper surface of the lower barrier layer or an upper surface of the lower conductive layer is substantially coplanar with an upper surface of the upper electrode.

14. The semiconductor device as claimed in claim 11, wherein the lower surface of the upper plug is positioned on a level lower than that of an upper surface of the upper electrode.

15. The semiconductor device as claimed in claim 11, further comprising:
a peripheral active region;
a peripheral gate on the peripheral active region;
a circuit conductive contact on a side surface of the peripheral gate and electrically connected to the peripheral active region; and
a peripheral contact structure on the circuit conductive contact,
wherein the peripheral contact structure includes a peripheral lower plug and a peripheral upper plug on the peripheral lower plug.

16. The semiconductor device as claimed in claim 15, wherein an upper surface of the peripheral lower plug and an upper surface of the lower plug are substantially coplanar.

17. The semiconductor device as claimed in claim 11, wherein a first height of the lower plug in a vertical direction is less than a second height of the upper plug.

18. A semiconductor device, comprising:
a substrate having a cell region and a peripheral region;
a first structure on the cell region;
an information storage structure on the first structure;
a contact structure on the information storage structure;
a second structure on the peripheral region; and
a peripheral contact structure on the second structure,
wherein:
the information storage structure includes a lower electrode, a dielectric layer on the lower electrode, and an upper electrode on the dielectric layer,
the contact structure includes a lower plug buried in the upper electrode and an upper plug on the lower plug,
an upper surface of the lower plug is substantially coplanar with an upper surface of the upper electrode,
a first width of the upper surface of the lower plug is narrower than a second width of a lower surface of the upper plug, and
the peripheral contact structure includes a peripheral lower plug and a peripheral upper plug on the peripheral lower plug.

19. The semiconductor device as claimed in claim 18, wherein
the lower surface of the upper plug is in contact with the upper surface of the lower plug,
a lower surface of the peripheral upper plug is in contact with an upper surface of the peripheral lower plug, and
each of the lower plug, the upper plug, the peripheral lower plug, and the peripheral upper plug includes a conductive layer and a barrier layer surrounding a lower surface and side surfaces of the conductive layer.

20. The semiconductor device as claimed in claim 18, wherein
the first structure includes a cell active region, a word line crossing the cell active region, a bit line on the word line, and a conductive contact on a side surface of the bit line and electrically connecting a portion of the cell active region and the lower electrode to each other, and
the second structure includes a peripheral active region, a peripheral gate on the peripheral active region, and a circuit conductive contact on a side surface of the peripheral gate and electrically connecting the peripheral active region and the peripheral contact structure to each other.

* * * * *